(12) United States Patent
Foreman et al.

(10) Patent No.: US 6,548,602 B2
(45) Date of Patent: Apr. 15, 2003

(54) POLYMERIC FILM COMPOSITIONS HAVING CONTROLLED VISCOSITY RESPONSE TO TEMPERATURE AND SHEAR

(75) Inventors: Thomas Kevin Foreman, Sayre, PA (US); Mark Robert McKeever, Sayre, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/891,642

(22) Filed: Jun. 26, 2001

(65) Prior Publication Data

US 2001/0051689 A1 Dec. 13, 2001

Related U.S. Application Data

(63) Continuation of application No. 09/260,835, filed on Mar. 2, 1999, now abandoned, which is a continuation-in-part of application No. 09/035,454, filed on Mar. 5, 1998, now abandoned.

(51) Int. Cl.$^7$ .......................... C08F 20/06; C08F 20/56; C08F 120/06; C08F 120/56
(52) U.S. Cl. ...................... 525/242; 525/301; 525/309
(58) Field of Search ................................ 525/309, 301, 525/242

(56) References Cited

U.S. PATENT DOCUMENTS

| | | |
|---|---|---|
| 3,879,494 A | 4/1975 | Milkovich et al. |
| 4,680,352 A | 7/1987 | Janowicz et al. |
| 4,694,054 A | 9/1987 | Janowicz |
| 4,722,984 A | 2/1988 | Janowicz |
| 5,231,131 A | 7/1993 | Chu et al. |
| 5,288,589 A | 2/1994 | McKeever et al. |
| 5,324,779 A | 6/1994 | Jarrin et al. |
| 5,693,717 A | 12/1997 | Pfirmann et al. |
| 5,936,026 A | 8/1999 | Huybrechts et al. |
| 6,127,479 A | 10/2000 | Matsukura et al. |

OTHER PUBLICATIONS

Kawakami, Y., Macromers, Encyclopedia of Polymer Science and Engineering, 1987, 195–204, vol. 9, John Wiley & Sons, New York.

*Primary Examiner*—D. R. Wilson

(57) ABSTRACT

A polymeric film composition, which can readily be applied to a sheet-configured substrate and which resists creep at room temperature, even when the sheet/film combination is stored as a roll, is disclosed. The polymeric film composition has a viscosity of at least $3 \times 10^6$ Pa-s at a predetermined first lower temperature and at a shear stress of 10,000 Pa and a viscosity no greater than $1 \times 10^4$ Pa-s at a predetermined second higher temperature and at a shear stress of 50,000 Pa.

4 Claims, 25 Drawing Sheets

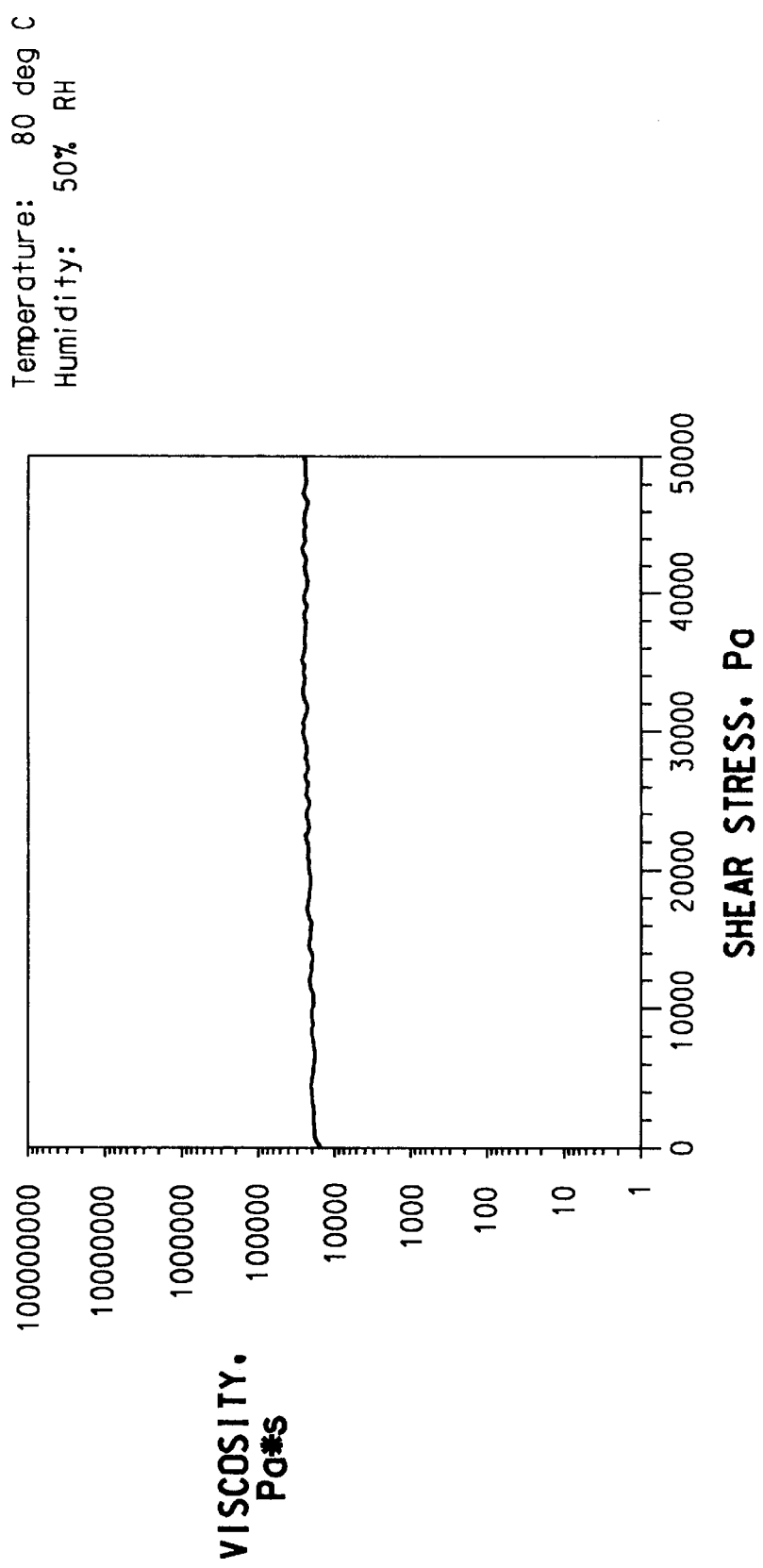

POLYMERIC FILM COMPOSITIONS HAVING CONTROLLED VISCOSITY RESPONSE TO TEMPERATURE AND SHEAR

RELATED APPLICATION

This is a Continuation Application of Ser. No. 09/260,835, filed Mar. 2, 1999 now abandoned, which is a Continuation-in-Part Application of Ser. No. 09/035,454, filed Mar. 5, 1998 now abandoned.

FIELD OF THE INVENTION

The present invention is directed to polymeric films having a rheology with controlled and frequently non-linear temperature and shear dependence. More specifically, it is directed to polymeric films having such rheology in the temperature range of 20–150° C. It is also directed to polymeric films which are photosensitive.

BACKGROUND OF THE INVENTION

Polymeric films frequently are used in applications where they are laminated to another film or surface. For storage stability, these films must have relatively high viscosity at room temperature. Without this the films will exhibit creep or flow around the edges, particularly when stored in roll form. However, to laminate effectively, the film must flow and have low viscosity at the lamination temperature, which is typically 70–150° C. This is particularly true for photosensitive films which are used as photoresists or solder masks. Such films are laminated onto substrates from which printed circuit boards are manufactured or onto printed circuit boards themselves, and must conform readily to irregular surfaces without air entrapment.

Most polymeric films have a linear viscosity response to temperature, i.e., the log of the viscosity of the film decreases linearly as the temperature increases. It is difficult to design polymeric systems that have a viscosity response that is steep enough to result both in excellent flow under laminating conditions and in excellent cold roll stability.

Furthermore, most polymeric films have a level viscosity response to shear stress, i.e., the log of the viscosity of the film is approximately constant as shear stress increases. It is difficult to obtain films which are stable at ambient temperatures and achieve excellent flow under the high shear laminating conditions.

It therefore would be useful to have a polymeric film in which the viscosity decreased rapidly and non-linearly with increasing temperature. Furthermore, it would be useful to have a film in which the viscosity decreased with increasing shear stress.

SUMMARY OF THE INVENTION

The present invention is directed to a polymeric film composition having a rheology wherein the viscosity changes substantially and sharply with temperature and with shear. The film has a viscosity of at least $3 \times 10^6$ Pa-s at a predetermined first lower temperature and a shear stress of 10,000 Pa; the film has a viscosity of no greater than $1 \times 10^4$ Pa-s at a predetermined second higher temperature and a shear stress of 50,000 Pa. The lower temperature is generally in the range of 20–50° C. and the higher temperature is generally in the range of 70–90° C.

In one embodiment, the film composition comprises a comb polymer comprising a backbone and more than one polymeric arm, wherein one of the following conditions is met:

I. (i) the polymeric arms are copolymers derived from monomers comprising 40–80% by weight of a monomer having a functionality capable of hydrogen bonding;
(ii) the number average molecular weight of the polymeric arms is greater than 2500; and
(iii) the weight ratio of the backbone to the arms is less than 3;

OR

II. (i) the polymeric arms a mers derived from monomers comprising greater than 70% by weight of a monomer having a functionality capable of hydrogen bonding;
(ii) the number average molecular weight of the polymeric arms is less than 2500; and
(iii) the weight ratio of the backbone to the arms is less
(iii) the weight ratio of backbone to arm is less than 4.

In another embodiment, the film composition comprises:

A. a comb polymer comprising a backbone and more than one polymeric arm, wherein (i) the polymeric arm is a copolymer comprising 20–40% by weight of a monomer having a functionality capable of hydrogen bonding and (ii) the weight ratio of backbone to arm is less than 3; and B. a linear polymer having functionality capable of hydrogen bonding.

In another embodiment, the invention relates to a polymeric film composition comprising a linear polymer and/or a comb polymer, wherein the linear and/or comb polymer have functionality capable of hydrogen bonding, and hydrophilic colloidal silica.

In another embodiment, the invention relates to a film composition comprising a first linear polymer having functionality capable of hydrogen bonding, and/or a comb polymer, hydrophilic colloidal silica and a second linear polymer having functionality capable of hydrogen bonding.

The invention also relates to a photosensitive film composition having a rheology wherein the viscosity changes substantially and sharply with temperature and with shear, the photosensitive composition comprising any of the compositions described above and further comprising an ethylenically unsaturated monomer and a photoinitiator system.

DESCRIPTION OF THE PREFERRED EMBODIMENTS

Figure 1A:
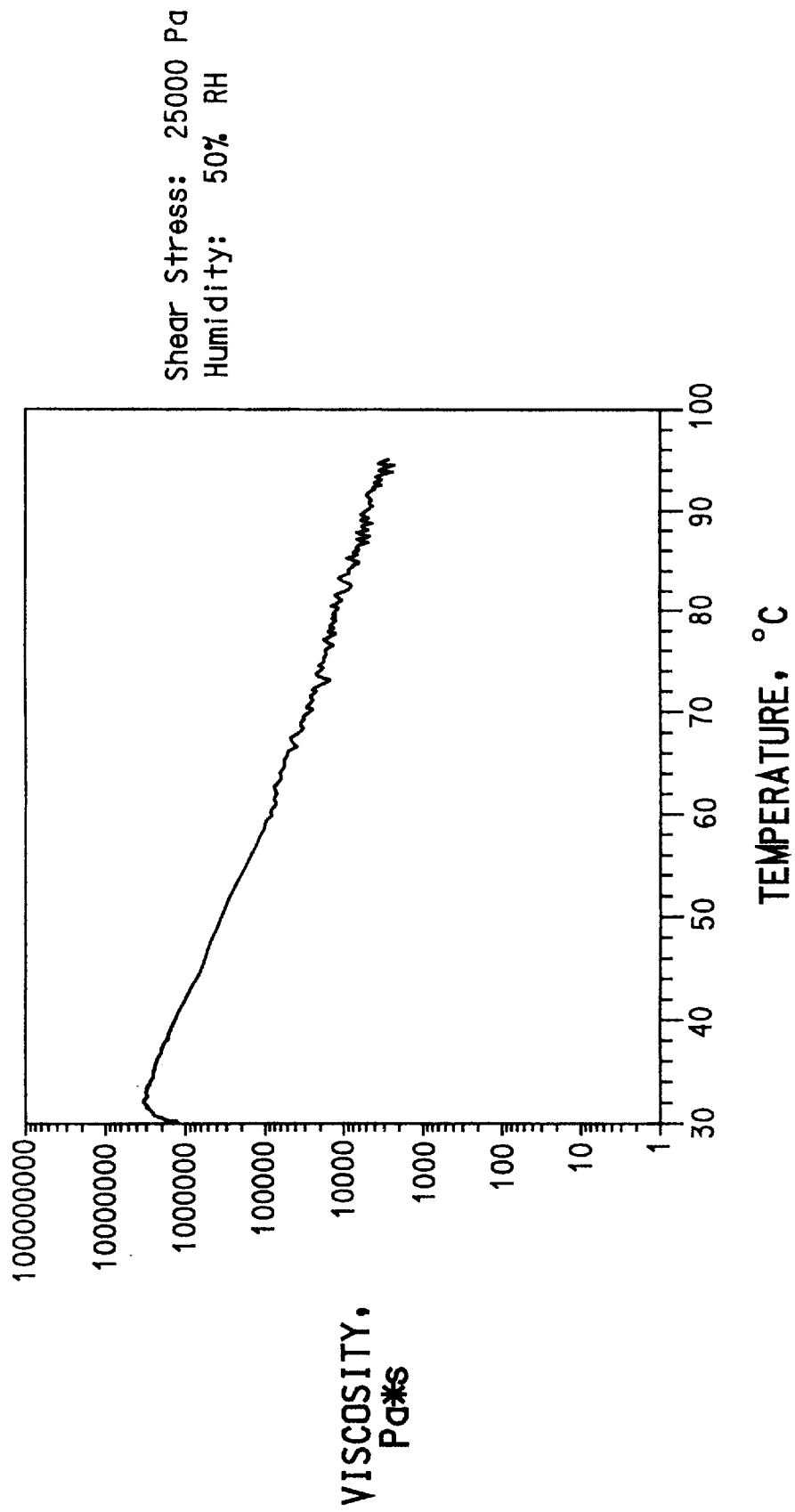
FIG. 1 shows (a) a plot of log viscosity versus temperature for a conventional linear polymer and (b) a plot of log viscosity versus shear stress for that polymer.

The polymeric films of the invention have a rheology wherein (a) the viscosity changes substantially and sharply with temperature and with shear. The films have a viscosity of at least $3\times10^6$ Pa-s at a predetermined first lower temperature and a shear stress of 10,000 Pa; the films have a viscosity of no greater than $1\times10^4$ Pa-s at a predetermined second higher temperature. The lower temperature is generally in the range of 20–50° C. and the higher temperature is generally in the range of 70–100° C. The films can be photosensitive and can be used as photoresists or solder masks in printed circuit applications. The films of the invention frequently have a nonlinear viscosity response to temperature, by which is meant that a plot of the log of the viscosity of the film versus temperature is a nonlinear curve with an increasingly negative slope over some portion of the plot. The term "photosensitive" is intended to mean that exposure to actinic radiation results in a change in properties, such that the exposed and unexposed areas pan be physically differentiated.

The films of the invention have a viscosity of at least $3\times10^6$ Pa-s at a predetermined first lower temperature and a shear stress of 10,000 Pa, and further have a viscosity of no greater than $1\times10^4$ Pa-s at a predetermined second higher temperature and a shear stress of 50,000 Pa. The lower temperature is typically the temperature at which the film is stored, typically ambient temperature of from about 20–50° C.; preferably about 40° C. The upper temperature is generally the lamination temperature, typically about 70–100° C.; preferably 80–90° C. A shear stress of about 10,000 Pa is representative of the shear stress the film would be under when stored in roll form. A shear stress of 50,000 Pa is typical of laminating conditions.

In one embodiment, the film composition comprises a comb polymer. The term "comb polymer" is intended to mean a polymer having a linear polymer backbone with at least two pendant polymeric arms. Comb polymers are also frequently referred to as "graft copolymers". The comb polymers which are useful in the polymeric compositions of the invention are those in which the polymeric arms have hydrogen-bonding functionality. To achieve non-linear viscosity response to temperature, the molecular weight of the polymeric arm, the overall molecular weight of the comb polymer, and the weight ratio of the backbone to the arm component are controlled according to the level of hydrogen-bonding monomer in the arm.

Functional groups which have hydrogen-bonding capability are well known and include carboxyl, amide, hydroxyl, amino, pyridyl, oxy, and carbamoyl. Preferred monomers with hydrogen-bonding functionality are acrylic acid, methacrylic acid and vinyl pyrrolidone. Methacrylic acid is particularly preferred. The hydrogen-bonding monomer is present in an amount of 35 to 85% by weight, based on the total weight of the polymeric arm of the comb polymer. Each polymeric arm can have a number average molecular weight in the range of 500 to 20,000.

The backbone of the comb polymer can be made from one or more compatible, conventional ethylenically unsaturated monomers. Preferred addition polymerizable, ethylenically unsaturated monomer components include: esters of acrylic and methacrylic acid with alcohols having 2–15 carbon atoms; acrylates and methacrylates substituted with functional groups such as hydroxy, amino and the like; styrene and substituted styrenes, such as alpha-methyl styrene; unsaturated acids such as acrylic acid, methacrylic acid, itaconic acid, maleic acid, and the like; vinyl acetate; vinyl chloride; butadiene; isoprene; acrylonitrile; and the like.

Comb polymers are typically prepared by copolymerizing a conventional monomer (to form the backbone) with a macromer (which forms the arms). Macromers are defined by Kawakami in the "Encyclopedia of Polymer Science and Engineering", Vol. 9, pp. 195–204 (John Wiley & Sons, New York, 1987) to be polymers of molecular weight ranging from several hundred to tens of thousands, with a functional group at the end that can further polymerize. In the formation of the comb polymers which are suitable for the polymeric compositions of the invention, the macromer is a polymer or copolymer of the monomer having a functionality capable of hydrogen bonding that is end-capped with an ethylenic group.

To obtain a comb polymer having non-linear viscosity dependence on temperature, the molecular weights, ratio of backbone to arms must be controlled according to the amount of hydrogen-bonding monomer present in the macromer. This can be accomplished when one of two different sets of conditions is met.

Case I:
(i) the polymeric arm is a copolymer comprising 40–80% by weight of a monomer having a functionality capable of hydrogen bonding;
(ii) the number average molecular weight of the polymeric arm is greater than 2500; and
(iii) the weight ratio of backbone to arm is less than 3;

Case II:
(i) the polymeric arm is a copolymer comprising greater than 70% by weight of a monomer having a functionality capable of hydrogen bonding;

(ii) the number average molecular weight of the polymeric arm is less than 2500; and (iii) the weight ratio of backbone to arm is less than 4.

The comb polymer may be prepared by any conventional addition polymerization process in which the macromer component is copolymerized with the monomer(s) of the backbone. The macromers are generally prepared according to the general descriptions in U.S. Pat. Nos. 4,680,352 and 4,694,054. Macromers are prepared by free radical polymerization processes employing cobalt(II) chelates of vicinal iminohydroxyimino compounds, dihydroxyimino compound, diazadihydroxyiminodialkyldecadienes, diazadihydroxyiminodialkylundecadienes, tetraazatetraalkylcyclotetradecatetraenes and dodecatetraenes, N,N'-bis(salicylidene)ethylendiamines and dialkyldiazadioxodialkyldodecadienes and tridecadienes as catalytic chain transfer agents for controlling their molecular weight. Low molecular weight methacrylate macromers may also be prepared with a pentacyanocobaltate(II)(ii) catalytic chain transfer agent as disclosed in U.S. Pat. No. 4,722,984.

In general the comb polymer has a overall molecular weight greater than about 20,000; preferably greater than 30,000. The upper range on the molecular weight is generally limited only by processing considerations.

In another embodiment, a film having non-linear viscosity dependence on temperature can be obtained by using the combination of a comb polymer and a second linear polymer having functional groups with hydrogen-bonding capability. The comb polymer is one which does not by itself provide non-linear dependence. The polymeric arms of the comb polymer comprise 20–40% by weight, based on the total weight of the comb polymer, of a monomer having a functionality capable of hydrogen bonding. In addition, the weight ratio of backbone to arm is less than about 3. The comb polymer can be prepared as described above.

The second linear polymer is one having functional groups capable of hydrogen bonding. Such groups include carboxyl, amide, hydroxyl, amino, pyridyl, oxy, carbamoyl, and mixtures thereof. Examples of suitable polymers include homopolymers and copolymers of vinylpyrrolidone, acrylic acid and methacrylic acid, vinyl alcohol, vinyl acetate, caprolactone, substituted caprolactones, ethylene oxide, propylene oxide, ethylene glycol, propylene glycol, and others. Copolymers of more than one monomer, and mixtures of polymers can be used. Homopolymers and copolymers of vinylpyrrolidone, such as the copolymer of vinylpyrrolidone and vinyl acetate, are preferred. The amount of linear polymer present is generally in the range of 0.1 to 10% by weight, based on the total weight of comb polymer plus linear polymer.

In another embodiment, the film composition comprises a linear polymer having functionality capable of hydrogen bonding as a binder and hydrophilic colloidal silica. In general, the hydrophilic colloidal silica is present in an amount of about 1–20% by weight, based on the total film composition, or even greater. The upper limit on the amount of silica that can be added is determined by the ultimate film properties desired. As the silica loading increases much above 20%, properties such as mechanical integrity and flexibility may begin to deteriorate. It has been found that the effectiveness of the hydrophilic colloidal silica in modifying the rheology depends on the degree of hydration of the hydroxyl groups on the colloidal silica and the degree of agglomeration of silica particles. Hydrated silicas are generally effective at concentrations above 15 weight percent. Examples of such hydrated silicas include, for example, aqueous and nonaqueous colloidal dispersions and precipitated silicas. However, frequently it is not desirable to have such a high concentration of particulate material in the film composition. The level of hydrophilic colloidal silica can be reduced to 1–15% by weight by using hydrophilic colloidal silicas having a high percentage of hydroxyl groups that are not hydrated. Preferably the hydrophilic colloidal silica has a particle size of 0.2–1000 millimicrons and a surface area of about 50–1200 square meters per gram. The silica is usually about 99.8% silicon dioxide by weight (on a moisture free basis) and exists in three dimensional branched chain aggregates. The surface is hydrophilic and capable of hydrogen bonding. A preferred type of hydrophilic colloidal silica is fumed silica. By "fumed silica" is meant synthetic amorphous silica ($SiO_2$) formed by continuous flame hydrolysis, typically of $SiCl_4$. Fumed silica is available commercially under the trade names Aerosil from Degussa (Richfield, N.J.) and Cab-O-Sil from Cabot (Tuscola, Ill.). Fumed silica has been described in, for example, Degussa Technical Bulletin No. 11, September 1997.

The linear polymer binder is a film-forming material which has hydrogen bonding functionality. Examples of hydrogen bonding groups have been discussed above. Suitable binders include alkyl acrylate and methacrylate polymers and copolymers; poly(vinyl acetate) and its partially hydrolyzed derivatives; cellulose esters and ethers; copolymers of styrene and substituted styrene with monomers having hydrogen bonding functionality.

It is frequently advantageous to have binders which are aqueous processible, by which is meant that the binders are developable by aqueous alkaline solution. By "developable" is meant that the binders are soluble, swellable or dispersible in the developer solution. Preferably, the binder is soluble in the developer solution. One class of binders which is useful in the process of the invention is vinyl addition polymers containing free carboxylic acid groups. These are prepared from 30–94 mole percent of one or more alkyl acrylates and 70–6 mole percent of one or more alpha-beta ethylenically unsaturated carboxylic acids; more preferably from 61–94 mole percent of two alkyl acrylates and 39–6 mole percent of an alpha-beta ethylenically unsaturated carboxylic acid. Suitable alkyl acrylates for use in preparing these polymeric binders include methyl acrylate, ethyl acrylate, propyl acrylate, butyl acrylate, and the methacrylate analogs. Suitable alpha-beta ethylenically unsaturated carboxylic acids include acrylic acid, methacrylic acid, crotonic acid, maleic acid or maleic anhydride, and the like. Binders of this type, including their preparation, are described in German Application, OS 2,320,849, published Nov. 8, 1973. Also suitable are copolymers of styrene and substituted styrenes with an unsaturated carboxyl-containing monomer, as described in detail in British Patent 1,361,298.

The linear binder generally has a molecular weight greater than about 20,000; preferably greater than about 50,000, with the upper limit again limited only by processing considerations.

In another embodiment, film compositions having the desired viscosity response to temperature and shear stress are obtained by the addition of hydrophilic colloidal silica to Case I or Case II comb polymers. The hydrophilic colloidal silica generally shifts the viscosity curves so that the non-linear portion of the curve is at a higher temperature. In general, the hydrophilic colloidal silica is present in an amount of 1–20% by weight, preferably 2–10% by weight.

It will be understood that combinations of materials which alter the film rheology can be used, i.e., both hydrophilic colloidal silica and second polymers having hydrogen-bonding capability can be added to linear or comb polymer binders with hydrogen-bonding capability. It is possible to tailor the viscosity curve to suit the needs of the intended use by selecting the type of polymer binder, linear or comb, the addition of hydrophilic colloidal silica, the type of hydrophilic colloidal silica, and the addition of a second polymer capable of hydrogen bonding. In general, the binder component (linear or comb) is present in an amount of about 40–70% by weight based on the total weight of the composition; the hydrophilic colloidal silica is present in an amount of about 1–20% by weight, based on the total weight of the composition; the second polymer having hydrogen bonding functionality is present in an amount of about 0.1–10% by weight based on the weight of the binder component.

The dispersions or solutions of the polymeric compositions can be used, with or without pigments, to make coatings for industrial, cosmetic and automotive purposes.

Photosensitive Compositions

The polymeric compositions of the invention are particularly useful in photosensitive compositions such as photoresists, solder masks, proofing films, printing plates, and the like. Compositions useful for photoresists and solder masks will be further described to illustrate this invention. Photosensitive systems have been described in "Light-Sensitive Systems: Chemistry and Application of Nonsilver Halide Photographic Processes" by J. Kosar, John Wiley & Sons, Inc., 1965, and more recently in "Imaging Processes and Materials—Neblette's Eighth Edition" edited by J. Sturge, V. Walworth and A. Shepp, Van Nostrand Reinhold, 1989. In such systems, actinic radiation impinges on a material containing a photoactive component to induce a physical or chemical change in that material. A useful image or latent image which can be processed into a useful image can thereby be produced. Typically actinic radiation useful for imaging is light ranging from the near ultraviolet through the visible spectral regions, but in some instances may also include infrared, deep-ultraviolet, X-ray and electron beam radiation.

It is possible to prepare a comb polymer which is itself photosensitive by incorporating a photosensitive moiety directly into either the backbone or the polymeric arms of the comb polymer. However, generally photosensitive compositions are made from non-photosensitive comb polymers to which are added one or more photosensitive components. The photosensitive systems can be either positive-working, in which the areas exposed to actinic radiation are removed in the post-exposure processing step, or negative-working, in which the areas not exposed to actinic radiation are removed in the post-exposure processing step.

Particularly useful compositions are negative-working photopolymerizable compositions which contain a monomeric or oligomeric material and a photoinitiator system in addition to the comb polymer. In such systems, the comb polymer functions as a dispersible polymeric binder component to impart desired physical and chemical characteristics to the exposed and unexposed photo-polymerizable composition. Upon exposure to actinic radiation, the photoinitiator system induces chain propagated polymerization and/or crosslinking of the monomeric material by either a condensation mechanism or by free radical addition polymerization. While all photopolymerizable mechanisms are contemplated, the compositions and processes of this invention will be described in the context of free radical initiated addition polymerization of monomers having one or more terminal ethylenically unsaturated groups. In this context, the photoinitiator system, when exposed to actinic radiation, acts as a source of free radicals needed to initiate polymerization and/or crosslinking of the monomer.

Suitable monomers are nongaseous ethylenically unsaturated compounds having a boiling point above 100° C. at atmospheric pressure, and being capable of forming a high polymer by photoinitiated addition polymerization. Examples of such monomers are well known and include esters of acrylic and methacrylic acid with alcohols, glycols and polyols; ethyoxylated acrylate and methacrylate esters; acryloxy- and methacryloxy-alkyl ethers of bisphenol-A; and others. Mixtures of monomers can be used.

A particularly preferred class of monomers are t-butyl acrylate, cyclohexyl acrylate, hydroxy C1-C10-alkyl acrylate, butanediol diacrylate, hexamethylene glycol diacrylate, triethylene glycol diacrylate, tripropylene glycol diacrylate, pentaerythritol triacrylate, trimethylolpropane triacrylate, polyoxyethylated and polyoxypropylated trimethylolpropane triacrylate, di-(3-acryloxy-2-hydroxypropyl) ether of bisphenol-A, di-(3-acryloxy-2-hydroxypropyl) ether of tetrabromo-bisphenol A, or methacrylate analogs thereof.

The photoinitiator system has one or more compounds that directly furnish free radicals when activated by actinic radiation. The system also may contain a sensitizer that is activated by the actinic radiation, causing the compound to furnish the free radicals. Useful photoinitiator systems typically will contain a sensitizer that extends spectral response into the near ultraviolet, visible, and near infrared spectral regions.

Photoinitiator systems are well known and discussions of such systems can be found in, for example, "Photoreactive Polymers: The Science and Technology of Resists" by A. Reiser, John Wiley & Sons, New York, 1989, and "Radiation Curing: Science and Technology" edited by S. P. Pappas, Plenum Press, New York, 1992. Preferred photoinitiators include hexaarylbiimidazoles in association with a hydrogen donor; Michler's ketone and ethyl Michler's ketone, particularly in association with benzophenone; and acetophenone derivatives.

Other compounds conventionally added to photopolymer compositions can also be present to modify the physical properties of the film for a particular use. Such components include: other polymeric binders, plasticizers, fillers, thermal stabilizers, hydrogen donors, crosslinking agents, optical brighteners, ultraviolet radiation absorbers, adhesion modifiers, coating aids, and release agents.

FIGS. 1–8 show the viscosity response to temperature and to shear stress for different polymeric compositions. All of the compositions were photosensitive films having 60% binder polymer, based on the total weight solids.

Figure 1B:
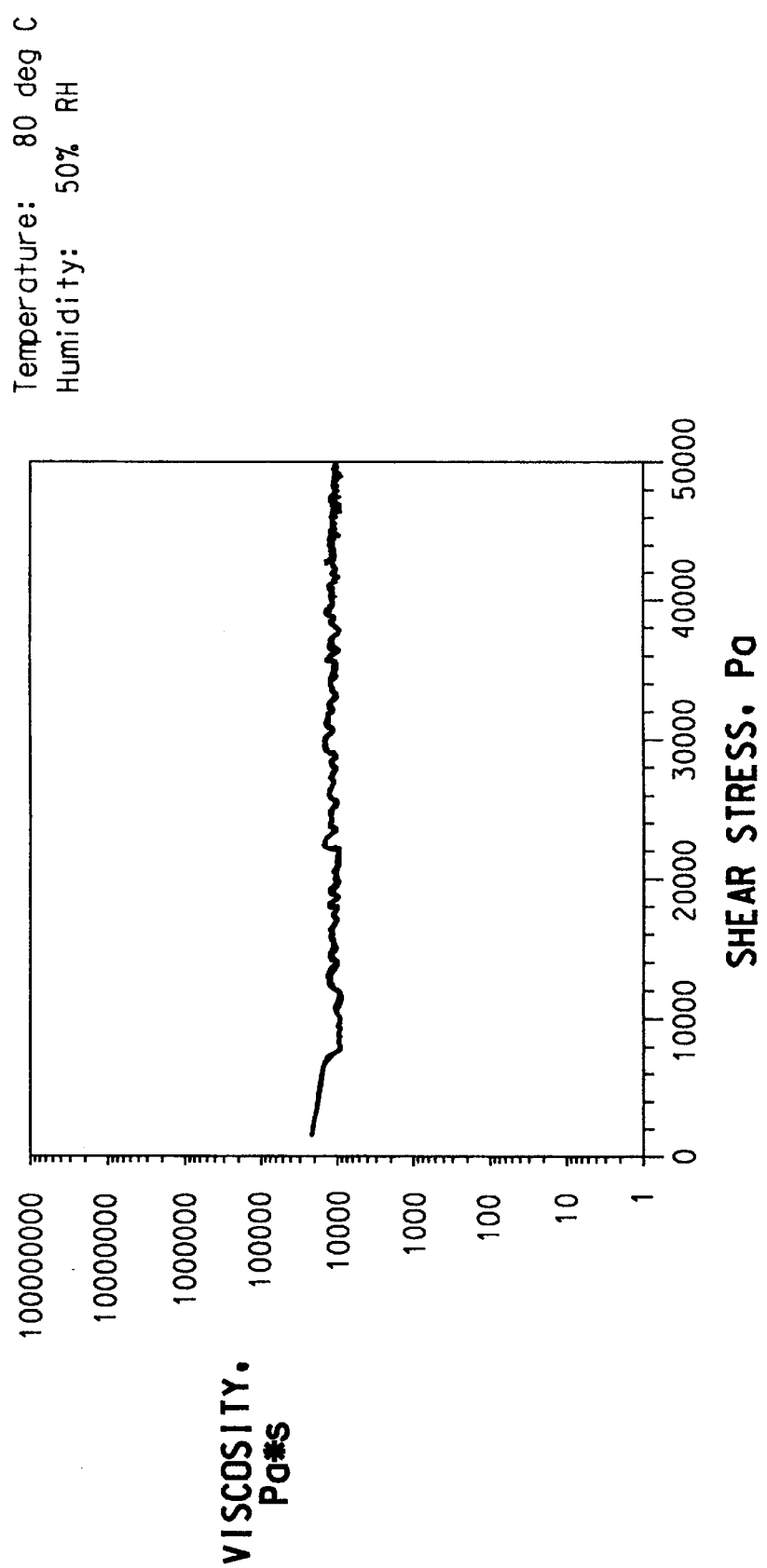

In FIG. 1, the binder polymer was a linear polymer with the composition methyl methacrylate/ethyl acrylate/methacrylic acid/butyl acrylate/styrene (30/3/23/24/20). In FIG. 1(a) the plot of log viscosity versus temperature shows a linear viscosity response in the temperature range of 35–95° C. In FIG. 1(b) the plot of log viscosity versus shear stress shows a level response, slope approximately zero. At all values of shear stress, the viscosity is about $1 \times 10^6$ Pa-s at 40° C., and about $6 \times 10^3$ Pa-sec at 90° C.

Figure 2A:
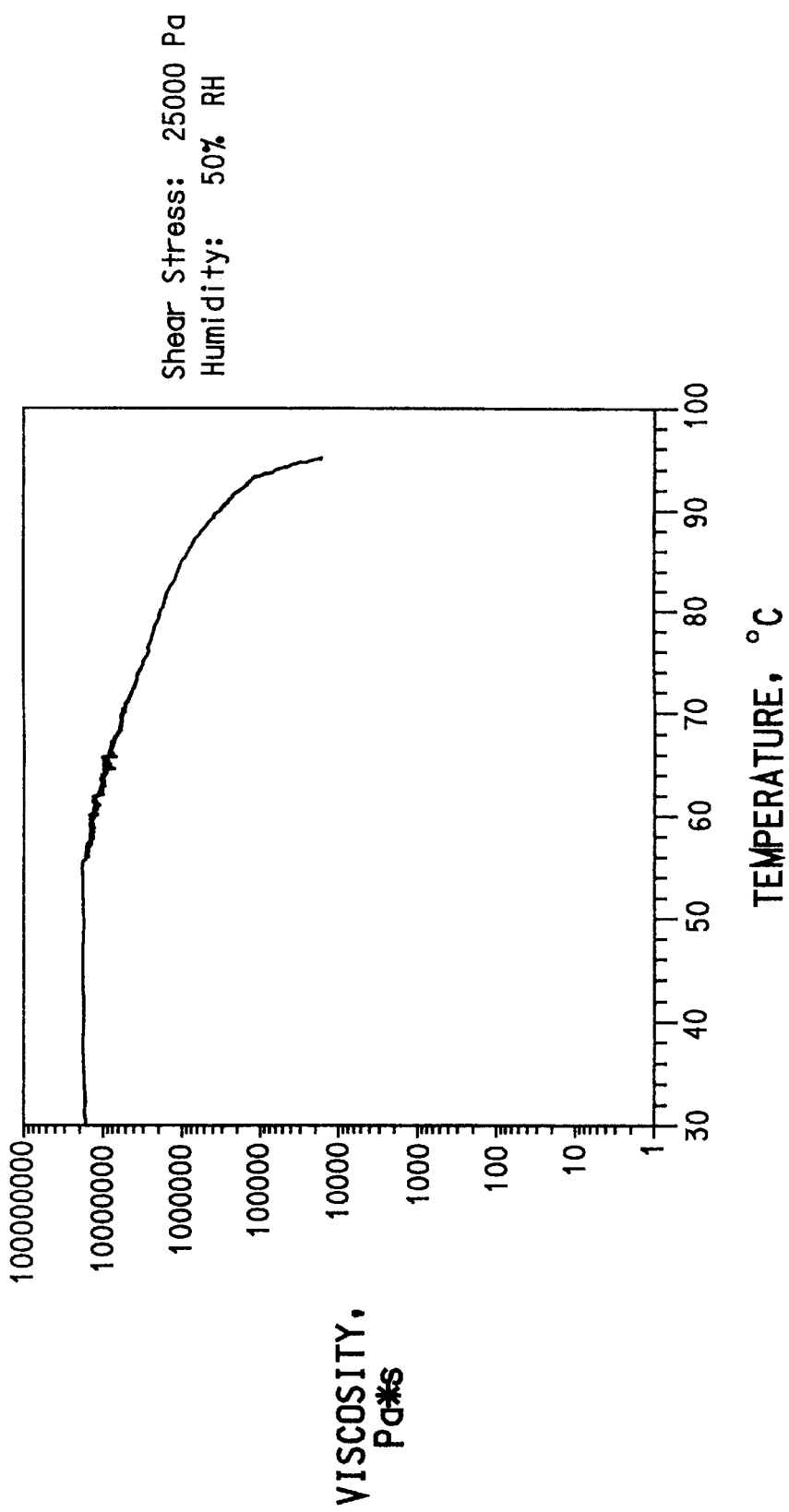
FIG. 2 shows (a) a plot of log viscosity versus temperature for a comb polymer according to the invention and (b) a plot of log viscosity versus shear stress for that polymer.
Figure 2B:
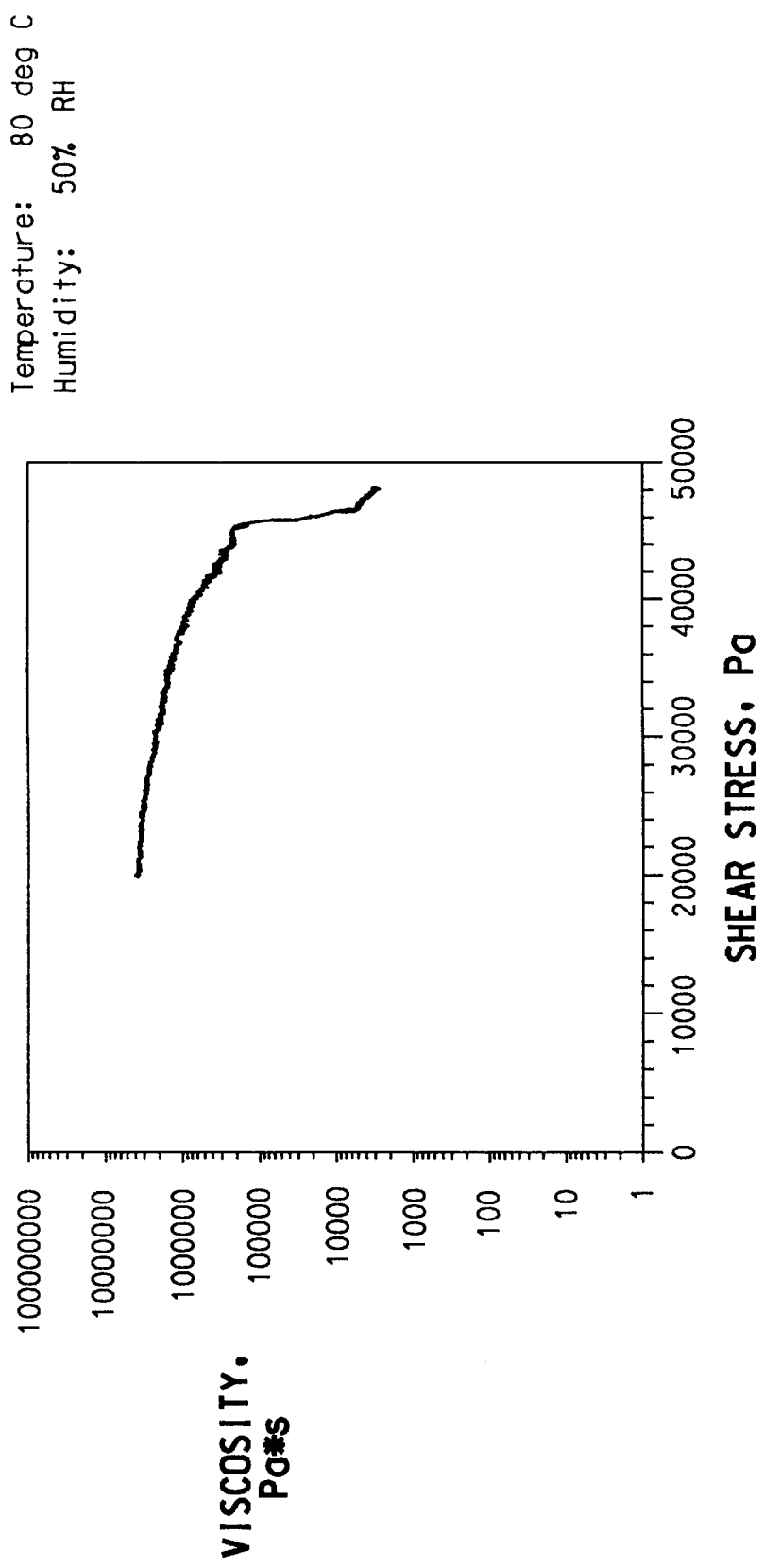

FIG. 2 illustrates a polymeric composition of the invention. The binder polymer was a comb polymer. The backbone was methyl acrylate/styrene/butyl acrylate (45/30/25) with polymeric arms of 50/50 methyl methacrylate/methacrylic acid. In FIG. 2(a), the plot shows a rapid, nonlinear viscosity decrease in the temperature range of 85–95° C. This is a useful temperature range for lamination. In FIG. 2(b) the plot of log viscosity versus shear stress shows a very steep negative slope. At a shear stress of 25,000 Pa, the viscosity is in excess of $1 \times 10^7$ Pa-s at temperatures below about 55° C.; at lower shear the viscosity would be even higher. At a shear stress of 50,000 Pa and temperature of 80° C., the viscosity is less than $2 \times 10^3$ Pa-s.

Figure 3A:
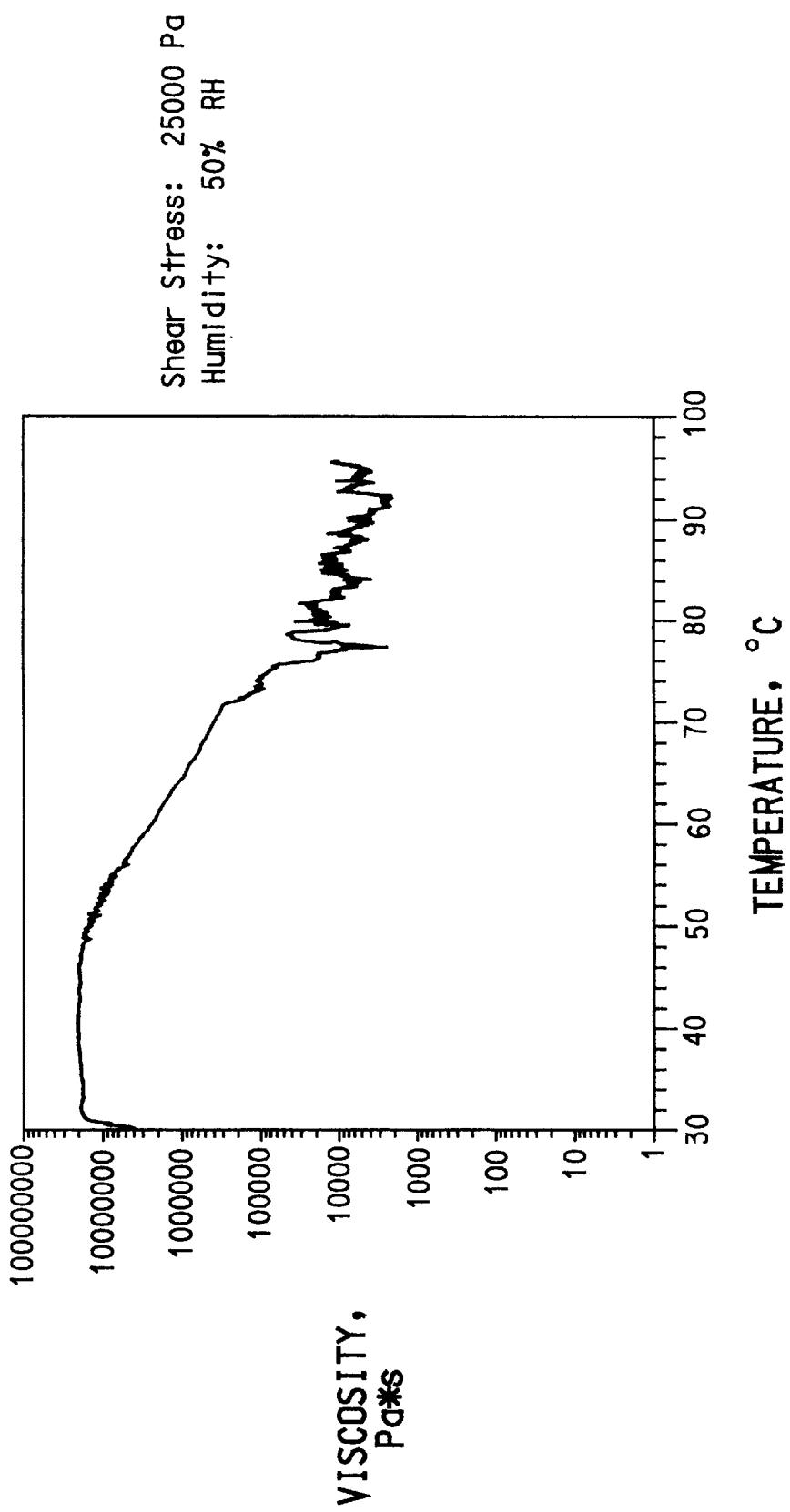
FIG. 3 shows (a) a plot of log viscosity versus temperature for a second comb polymer according to the invention and (b) a plot of log viscosity versus shear stress for that polymer.
Figure 3B:
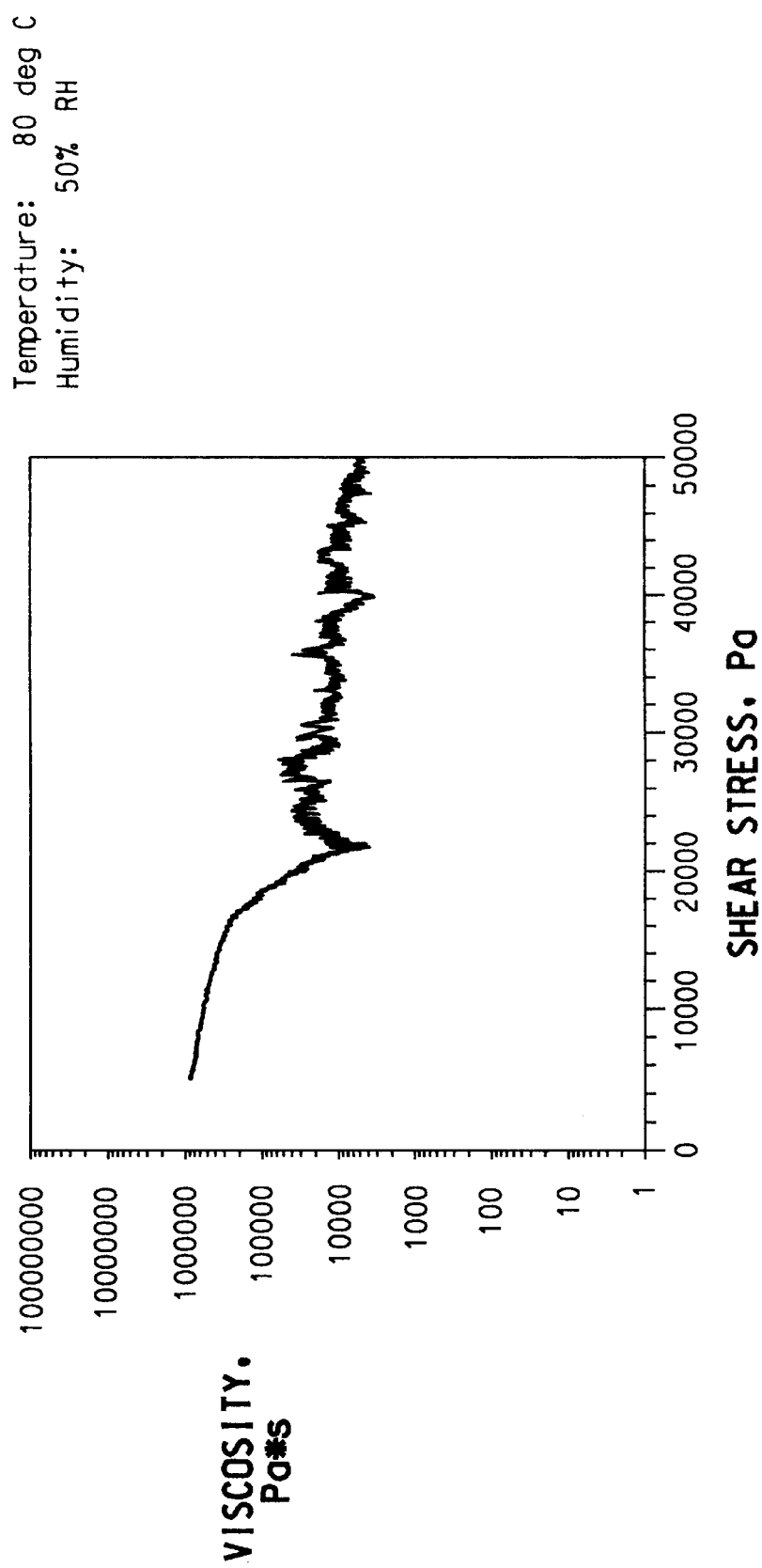

FIG. 3 illustrates a polymeric composition of the invention. The binder polymer was a second comb polymer. The backbone was the same as in FIG. 2, and the polymeric arms were 15/85 ethyl triethylene glycol methacrylate/methacrylic acid. In FIG. 3(a), the plot shows a very rapid, nonlinear viscosity decrease in the temperature range of 70–80° C. In FIG. 3(b), the plot of log viscosity versus shear stress shows a steep negative slope.

Figure 4A:
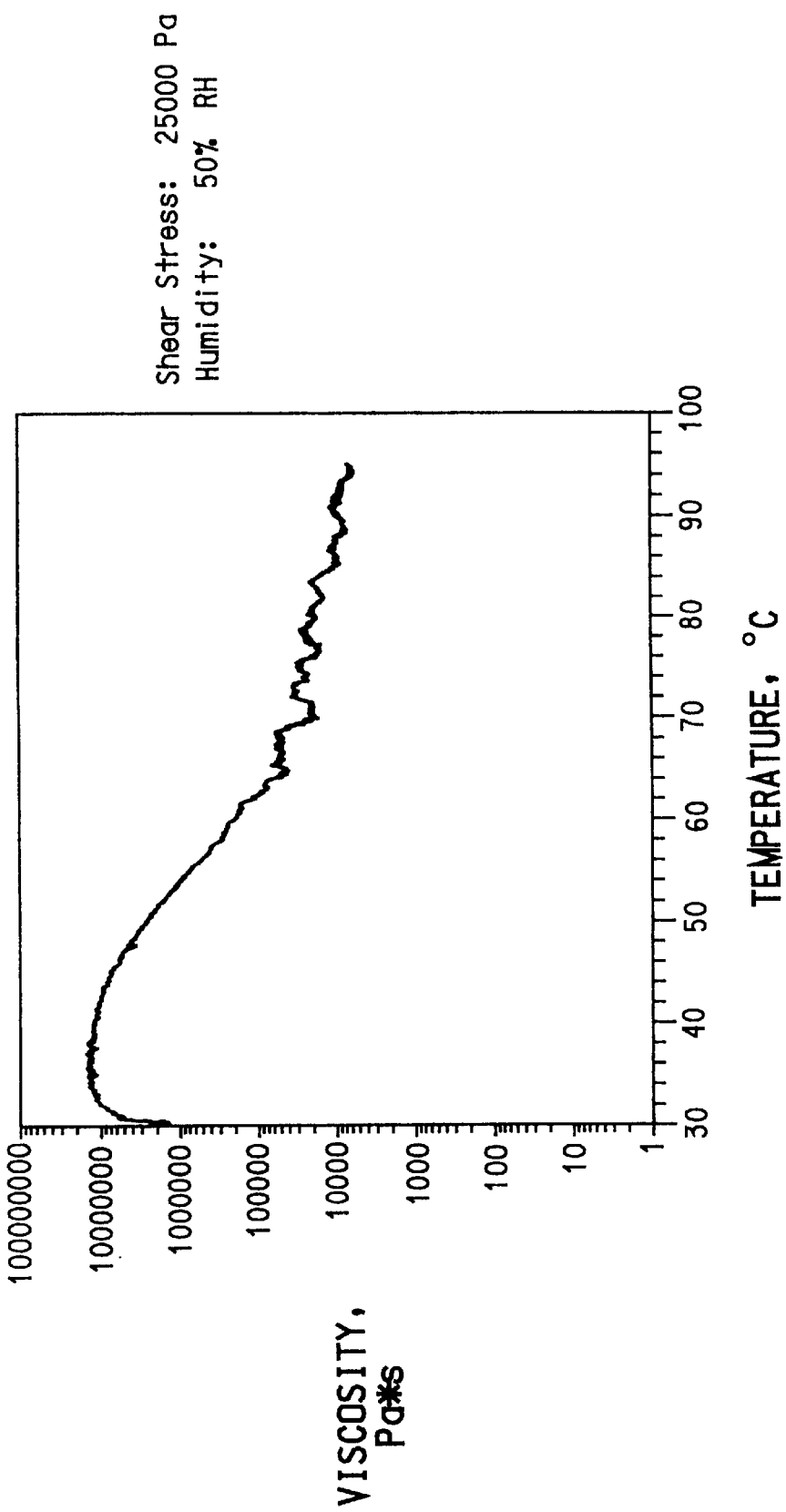
FIG. 4 shows (a) a plot of log viscosity versus temperature for a third comb polymer according to the invention and (b) a plot of log viscosity versus shear stress for that polymer.
Figure 4B:
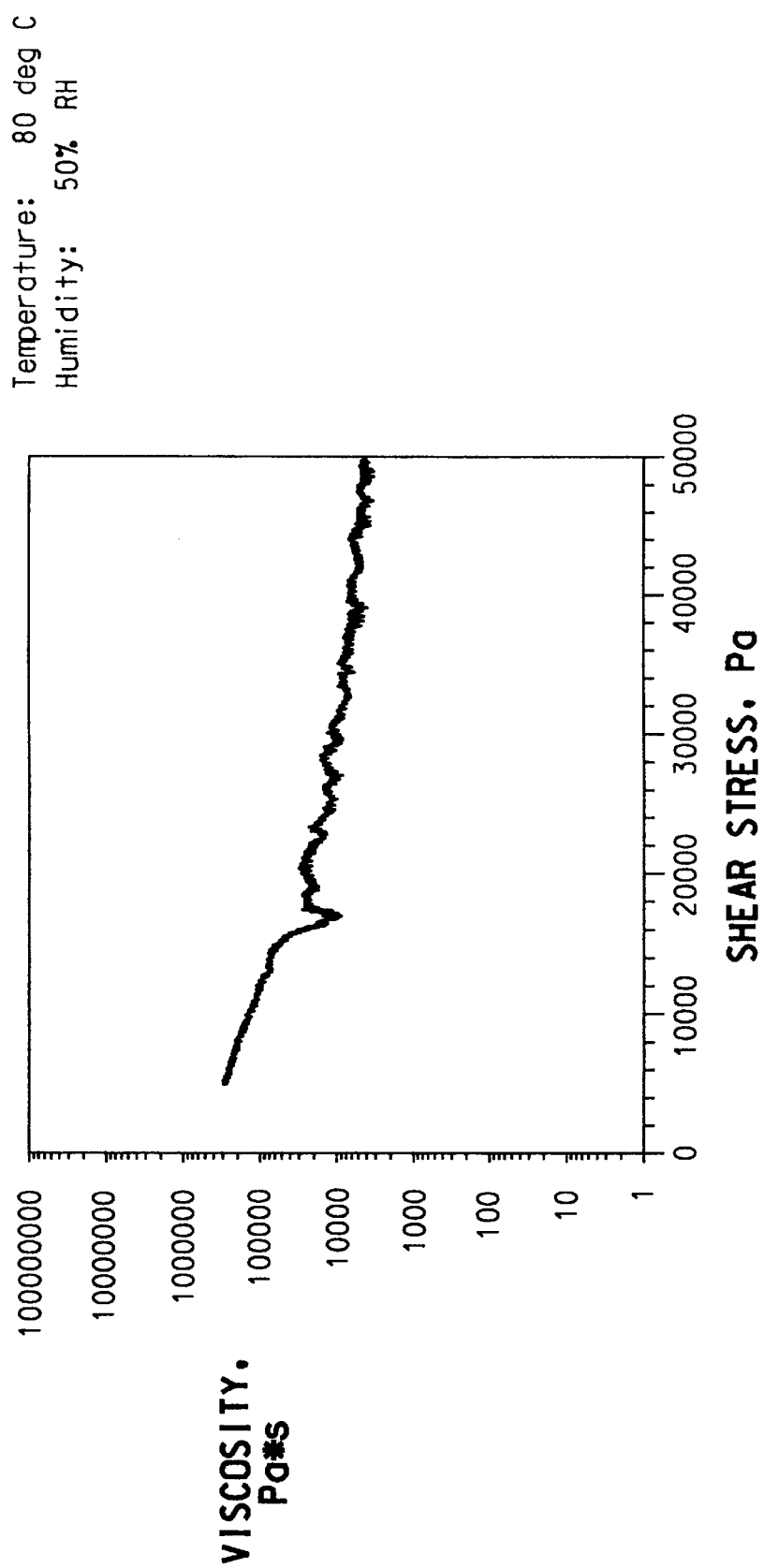

FIG. 4 illustrates a polymeric composition of the invention. The binder polymer was a third comb polymer. The polymeric arms were the same as in FIG. 2, and the backbone was methyl acrylate/styrene/butyl acrylate (17/45/38). In FIG. 4(a), the plot shows a very rapid, nonlinear viscosity decrease at a lower temperature range of 45–55° C. In FIG. 4(b), the plot of log viscosity versus shear stress shows a steep negative slope.

Figure 5A:
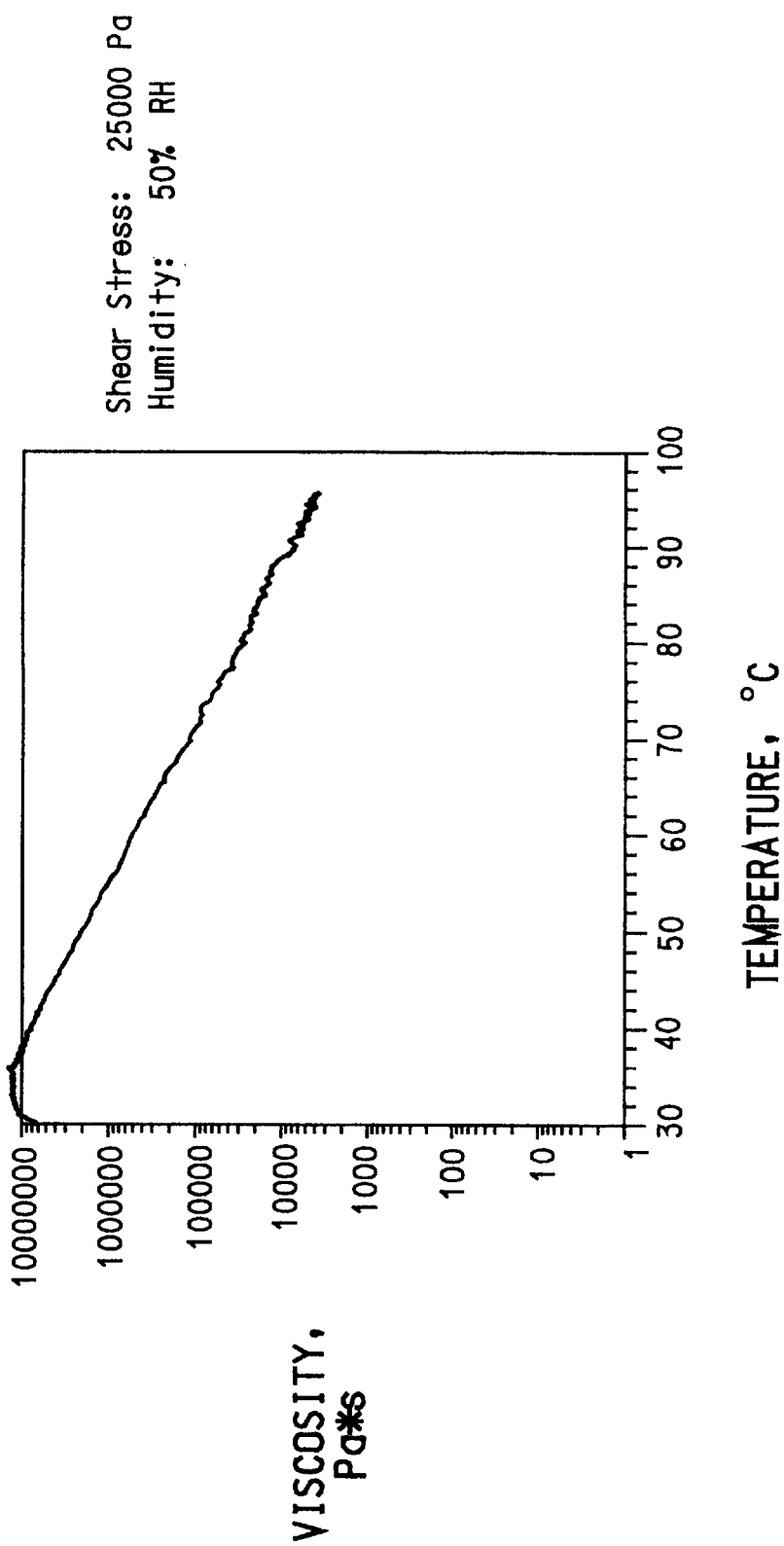
FIG. 5 shows (a) a plot of log viscosity versus temperature for a linear polymer; and (b) a plot of log viscosity versus temperature for the same linear polymer with polyvinylpyrrolidone added.
Figure 5B:
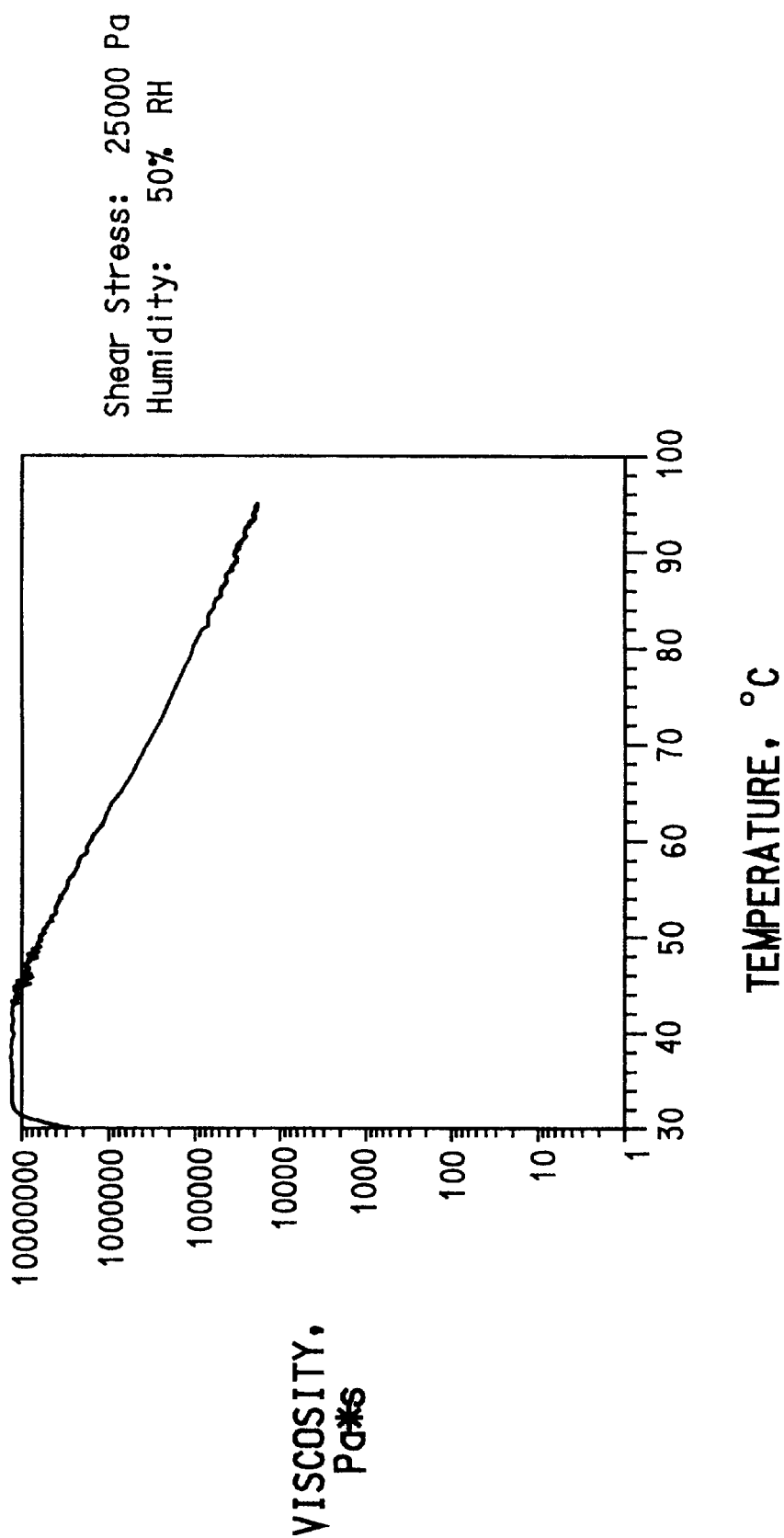

In FIG. 5, the binder polymer was a linear polymer with the composition methyl methacrylate/ethyl acrylate/methacrylic acid/butyl acrylate/styrene (30/3/23/24/20). hin FIG. 5(a) the plot of log viscosity versus temperature shows a linear viscosity response in the temperature range of 35–95° C. In FIG. 5(b), 3% by weight, based on the weight of the total binder polymer, polyvinyl-pyrrolidone was added. The plot of log viscosity versus temperature shows that the viscosity response in the temperature range of 35–95° C. is slightly higher, but remains linear.

Figure 6A:
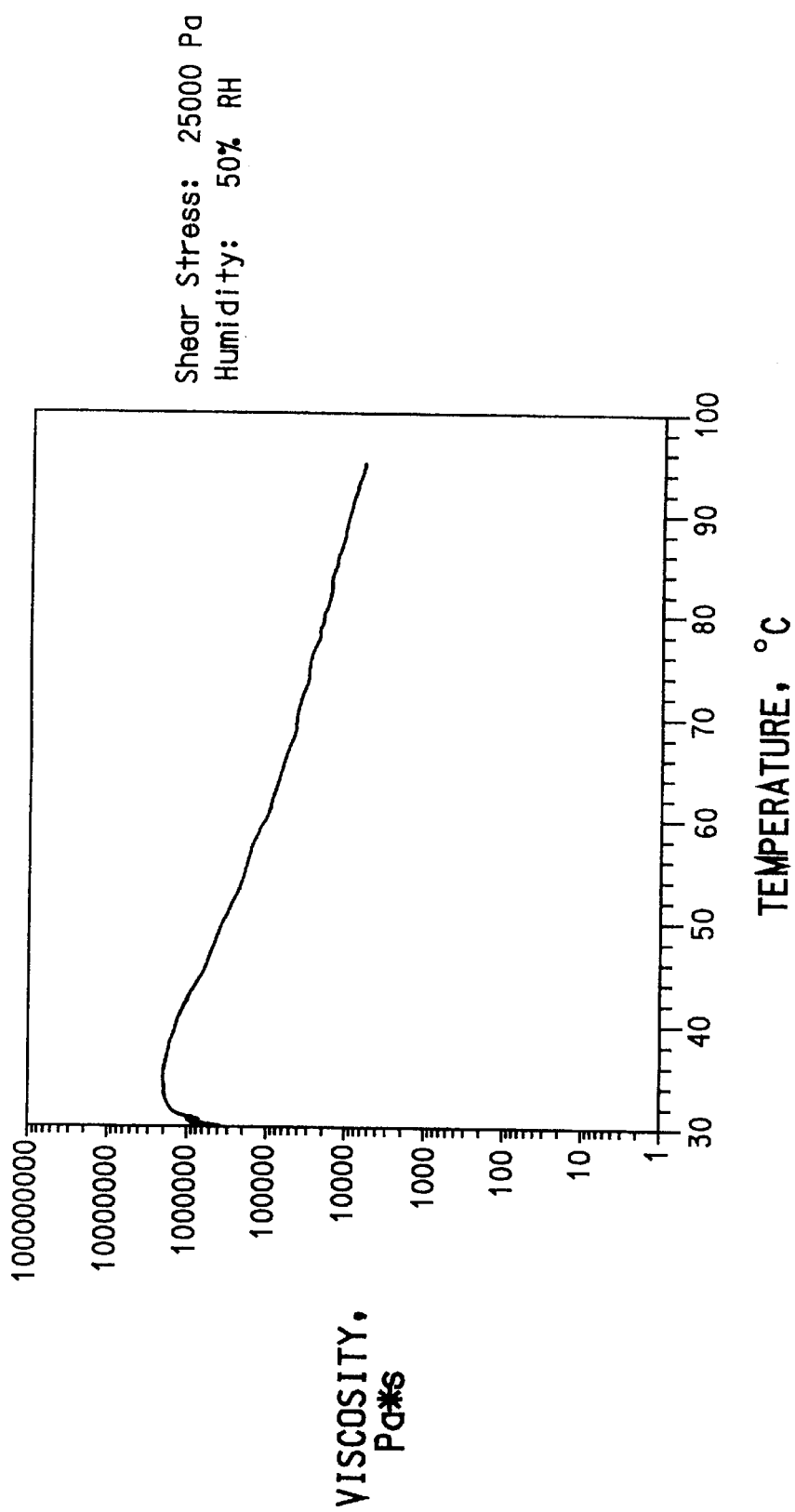
FIG. 6 shows (a) a plot of log viscosity versus temperature for a comb polymer (outside of the invention) with linear viscosity response to temperature; and (b) a plot of log viscosity versus temperature for the same comb polymer with polyvinylpyrrolidone added.
Figure 6B:
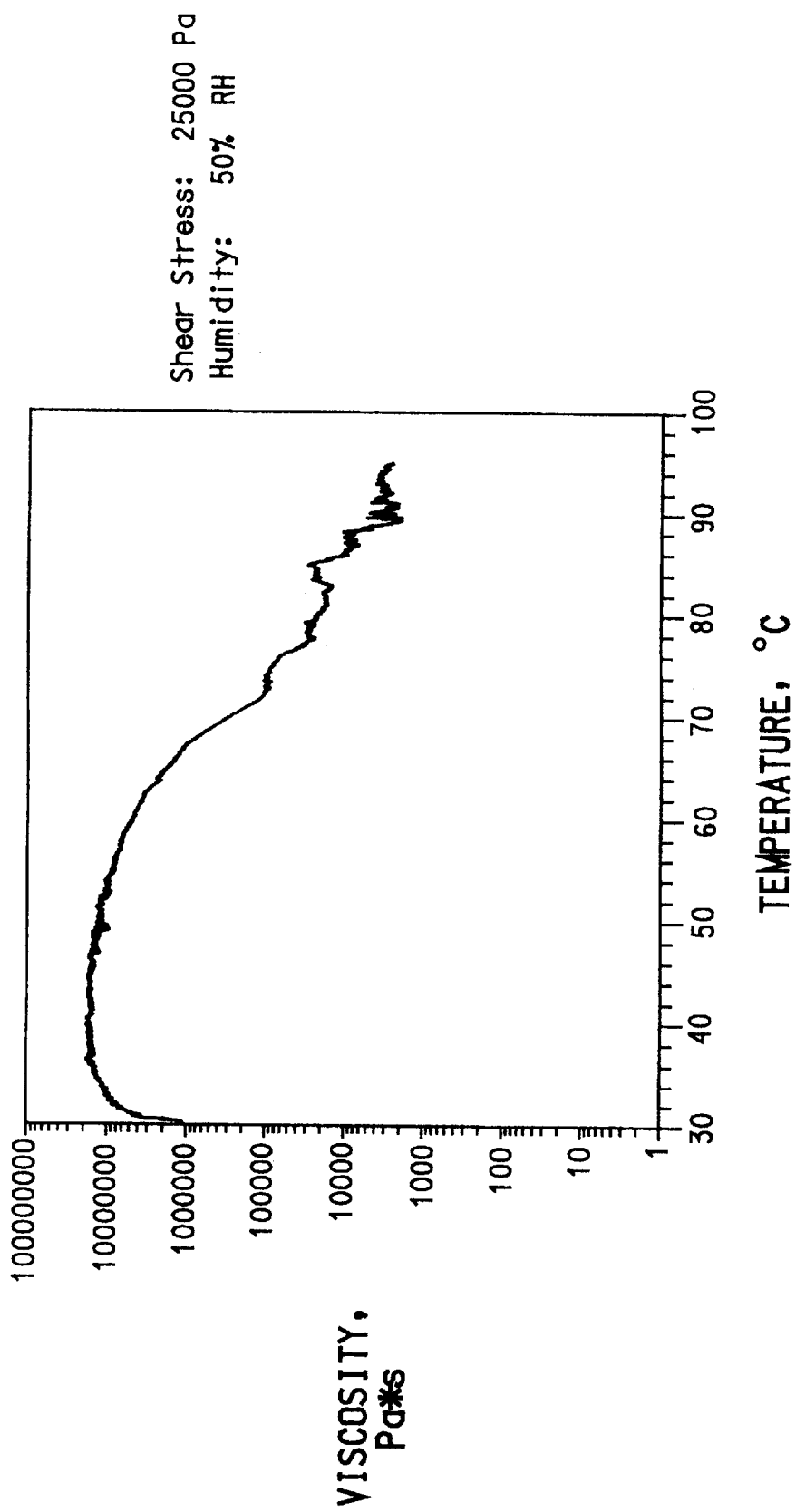

In FIG. 6, the binder polymer was a comb polymer having a backbone of methyl acrylate/styrene/butyl acrylate (45/30/25) with polymeric arms of 65/35 methyl methacrylate/methacrylic acid. FIG. 6(a) illustrates a polymeric composition using the comb polymer only, which is outside the invention. The plot of log viscosity versus temperature shows a linear viscosity response in the temperature range of 35–90° C. FIG. 6(b) illustrates a polymeric composition of the invention in which 3% by weight, based on the weight of the total binder polymer, polyvinylpyrrolidone was added to the comb polymer. The plot of log viscosity versus temperature shows a nonlinear viscosity decrease in the temperature range of 35–95° C.

In FIG. 7, the binder polymer was the same linear polymer as in FIG. 5.

Figure 7A:
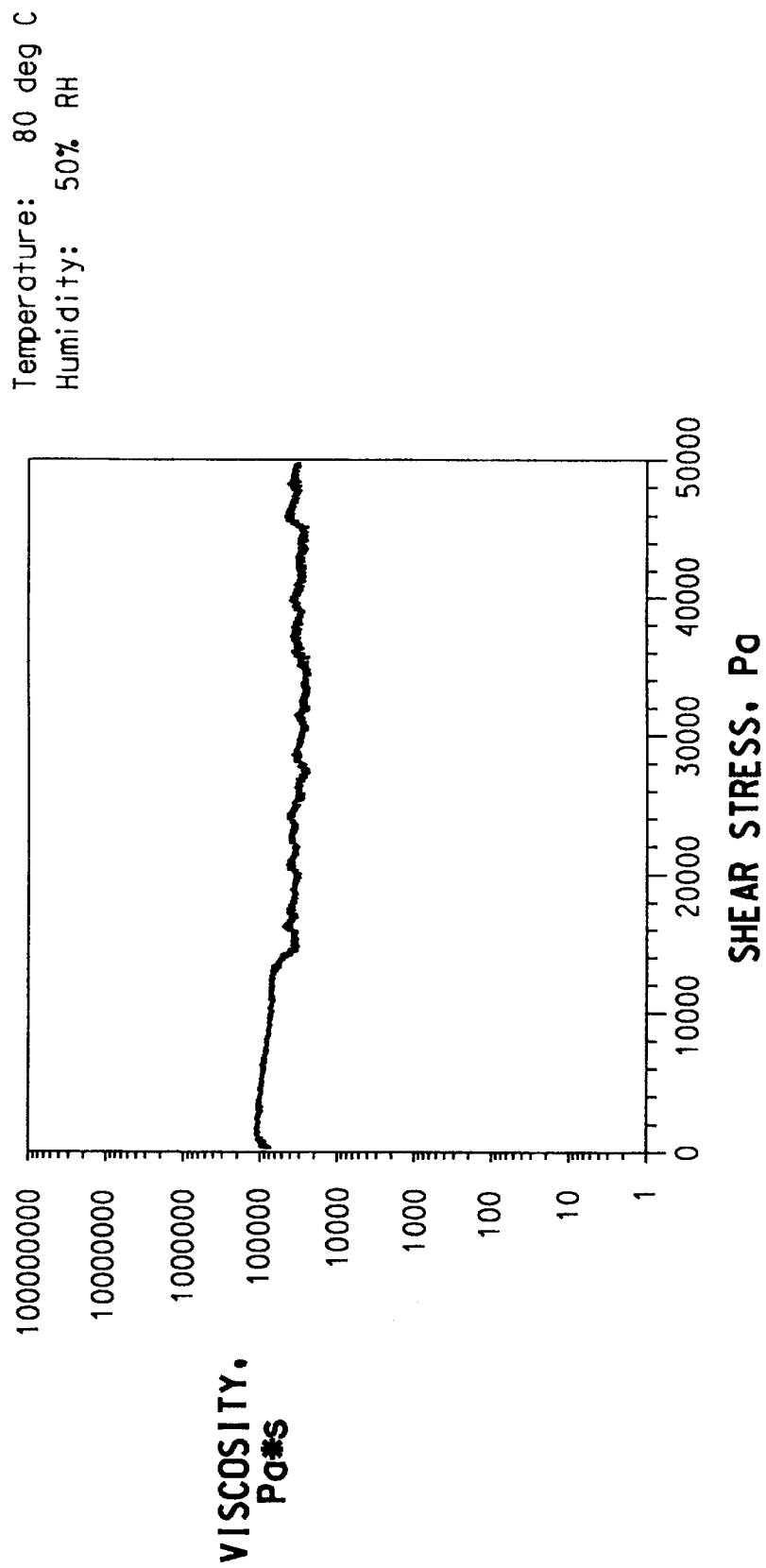
FIG. 7 shows (a) a plot of log viscosity versus shear stress for a linear polymer; and (b) a plot of log viscosity versus shear stress for the same linear polymer with polyvinylpyrrolidone added.
Figure 7B:
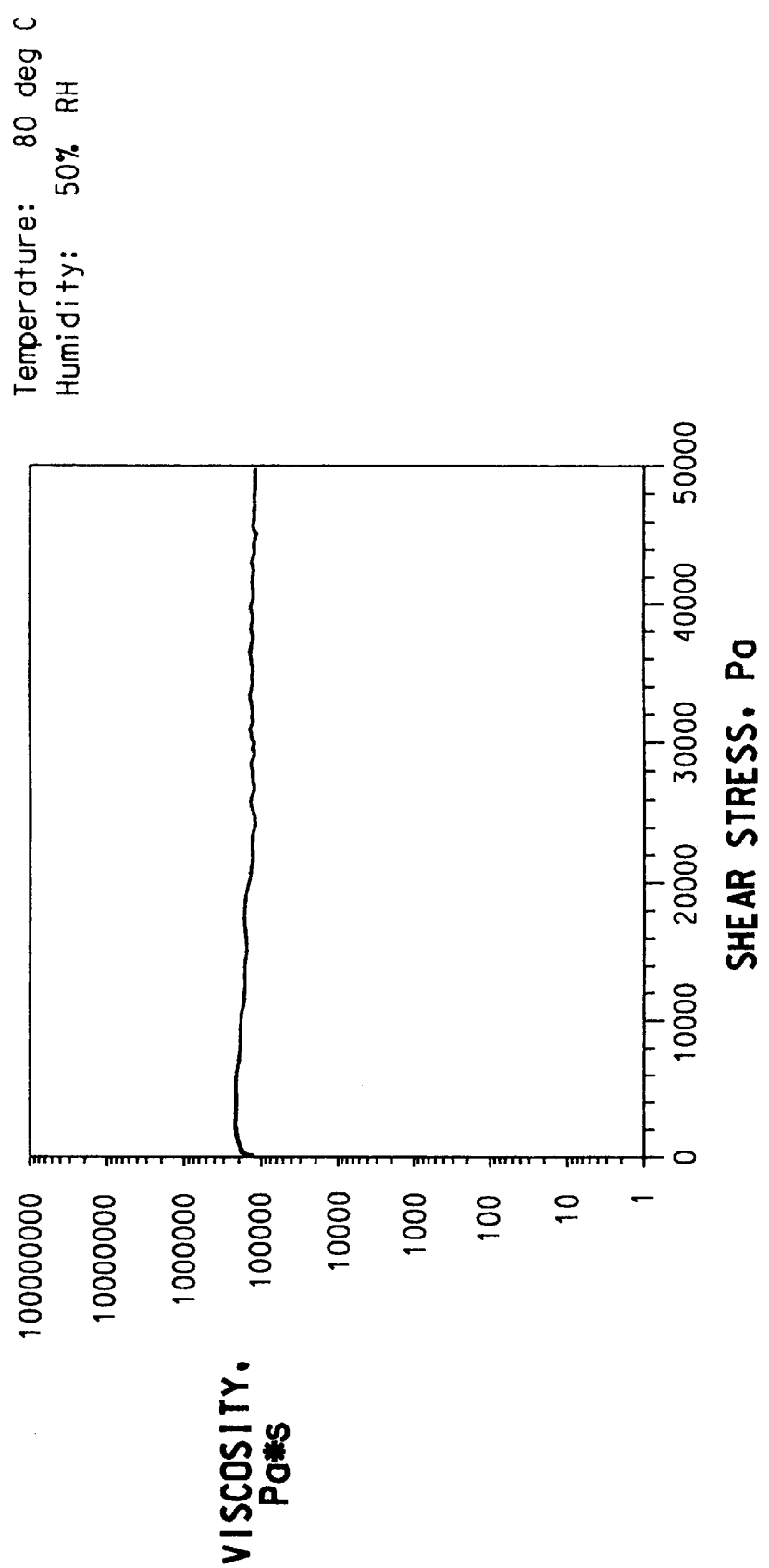

In FIG. 7(a), the plot of log viscosity versus shear stress shows a level response, slope approximately zero. FIG. 7(b) shows that the addition of 3 weight % of polyvinylpyrrolidone, based on the weight of the total binder polymer, does not change the slope of the curve.

Figure 8B:
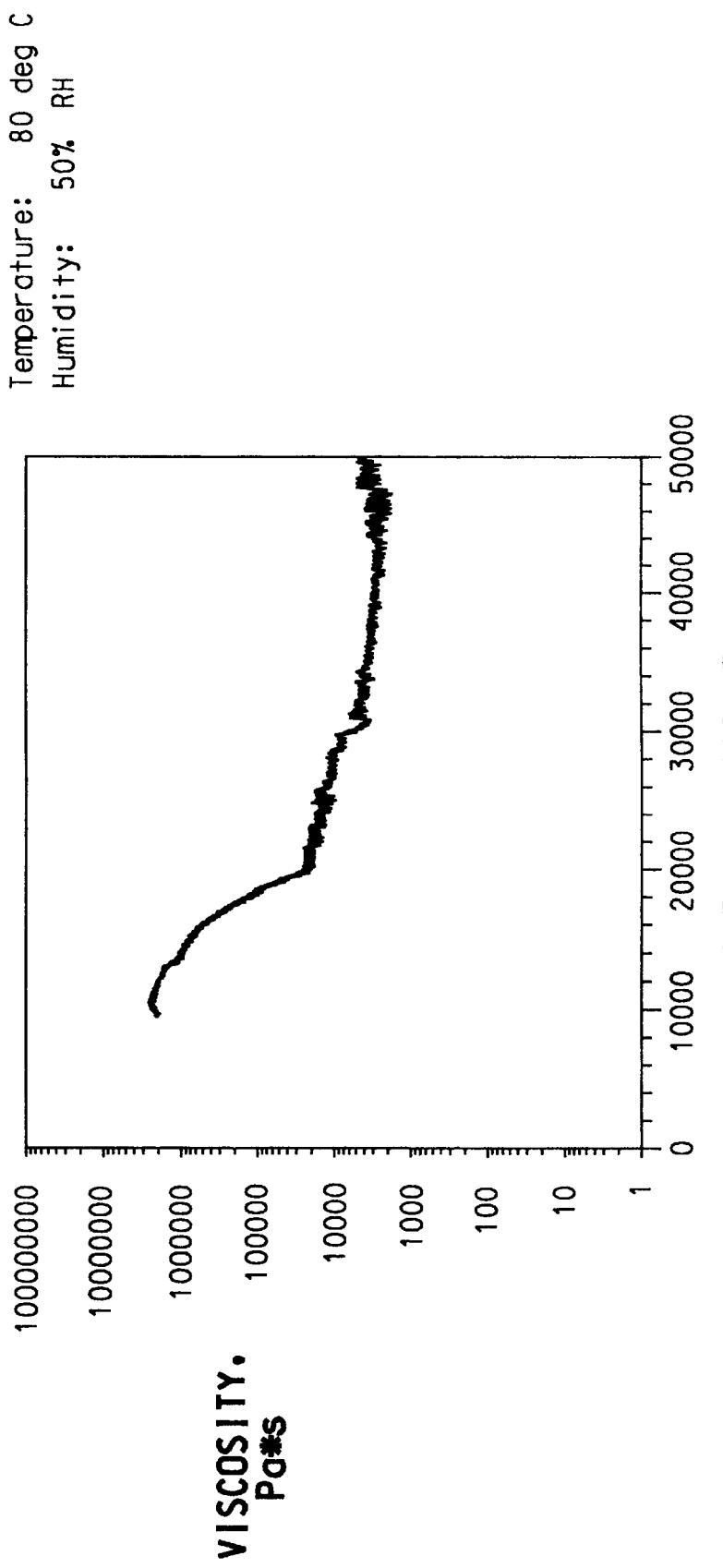
FIG. 8 shows (a) a plot of log viscosity versus shear stress for a comb polymer (outside of the invention) with linear viscosity response to shear stress; and (b) a plot of log viscosity versus shear stress for the same comb polymer with polyvinylpyrrolidone added.

In FIG. 8, the binder polymer was a comb polymer with the same composition as the polymer in FIG. 6. FIG. 8(a) illustrates the composition using the comb polymer only as binder, which is outside the invention. The plot of log viscosity versus shear stress shows a level response, slope approximately zero. In FIG. 8(b), with the addition of 3 weight % polyvinylpyrrolidone, based on the weight of the total binder polymer, the curve has a very steep negative slope.

Figure 9A:
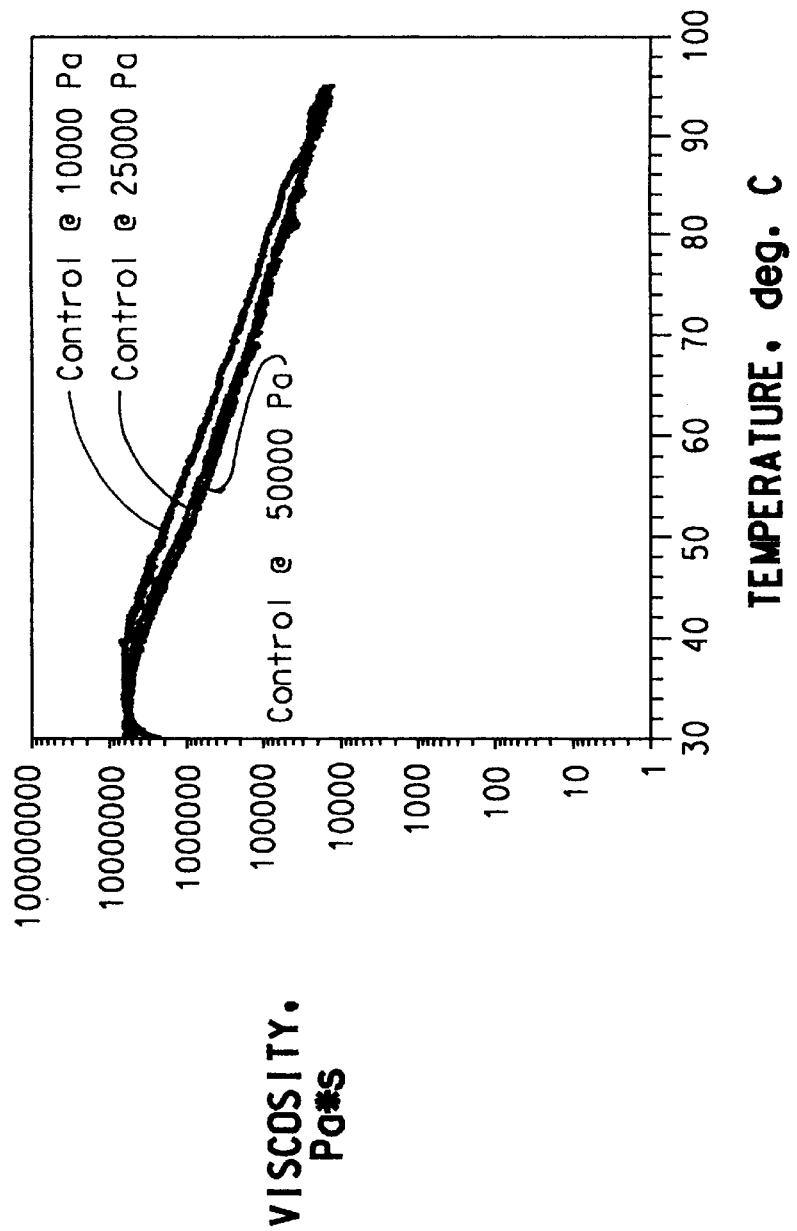
FIG. 9 shows (a) a plot of log viscosity versus temperature at three different shear stresses for a linear copolymer having a linear viscosity response to temperature and a level response to shear; and (b) a plot of log viscosity versus temperature at three different shear stresses for the same linear copolymer with fumed silica added.
Figure 9B:
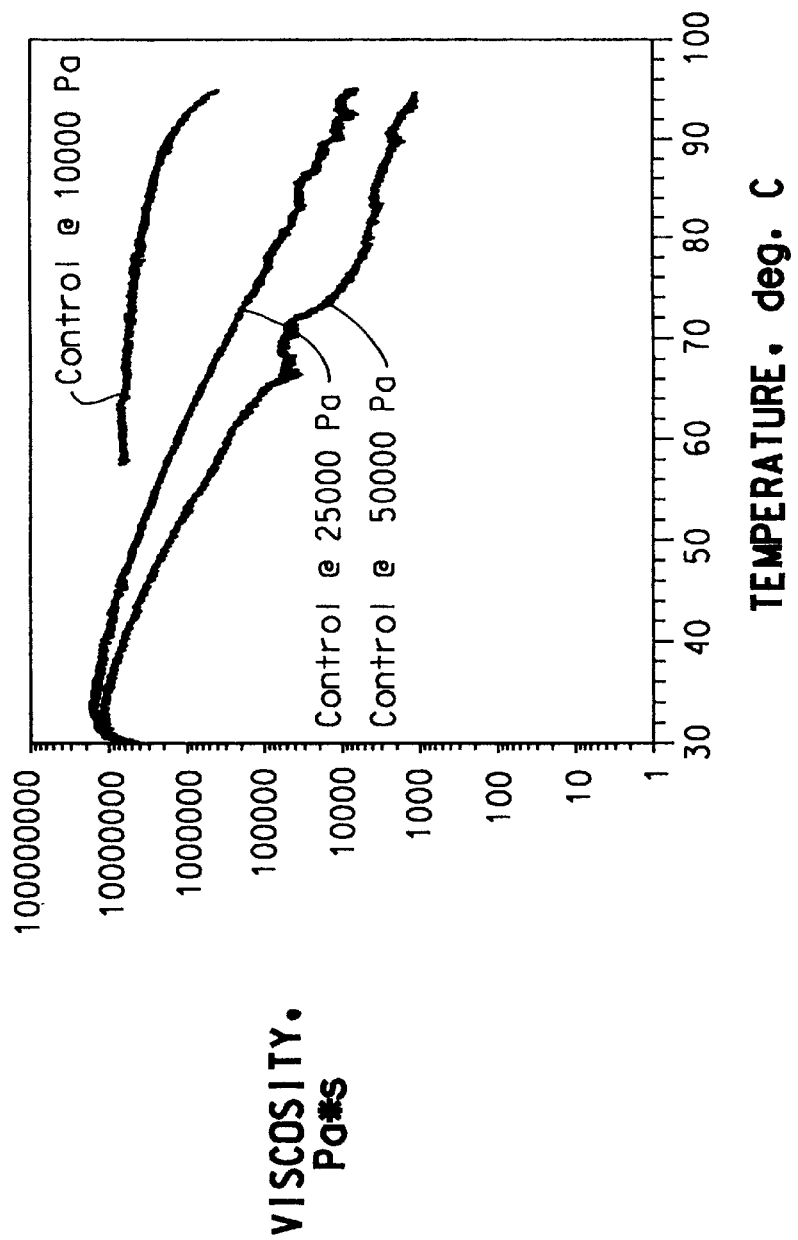

In FIG. 9, the binder polymer was a linear polymer of the composition methyl methacrylate/methacrylic acid/butyl acrylate/butyl methacrylate (36/23/16/25). In FIG. 9(a), the plot of log viscosity versus temperature is shown for three different shear stresses. The plot is essentially linear over the temperature range of 40–95° C. Furthermore, the viscosity was virtually unchanged when shear was increased. At 40° C. the viscosity was about $7 \times 10^6$ Pa-s; at 90° C. the viscosity was about $2 \times 10^4$ Pa-s. To the composition was added 10 wt % fumed silica with the resulting plot shown in FIG. 9(b). The addition of the fumed silica changed the viscosity response to nonlinear in the temperature range of 90–100° C. at low shear. Furthermore, at 90° C., the viscosity decreased by almost three orders of magnitude as shear was increased from 10,000 Pa to 50,000 Pa. At 40° C. and 10,000 Pa shear stress, the viscosity was in excess of $10^7$ Pa-s. At 90° C. and 50,000 Pa shear stress, the viscosity was about $2 \times 10^3$ Pa-s.

Figure 10A:
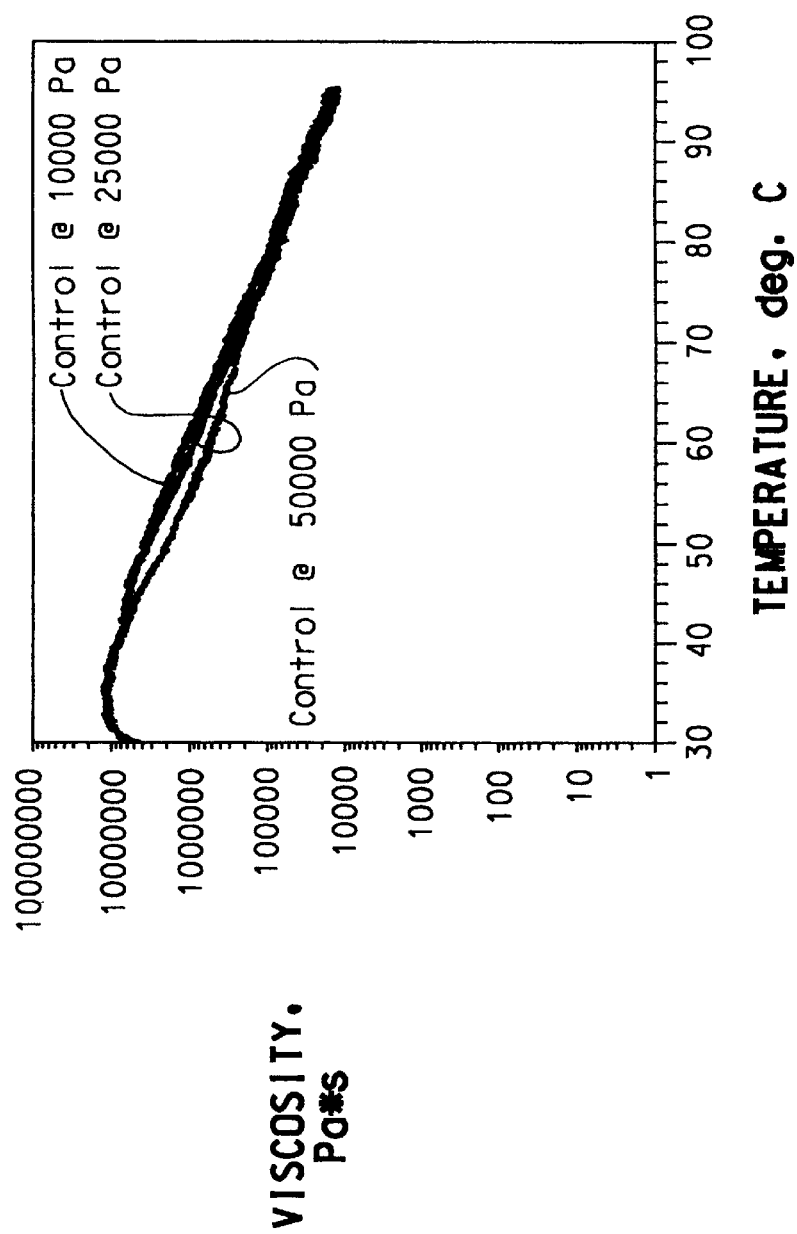
FIG. 10 shows (a) a plot of log viscosity versus temperature at three different shear stresses for a linear copolymer having a linear viscosity response to temperature and a level response to shear; (b) a plot of log viscosity versus at three different shear stresses for the same linear copolymer with fumed silica added; and (c) a plot of log viscosity versus at three different shear stresses for the same linear copolymer with a different type of hydrophilic colloidal silica added.
Figure 10B:
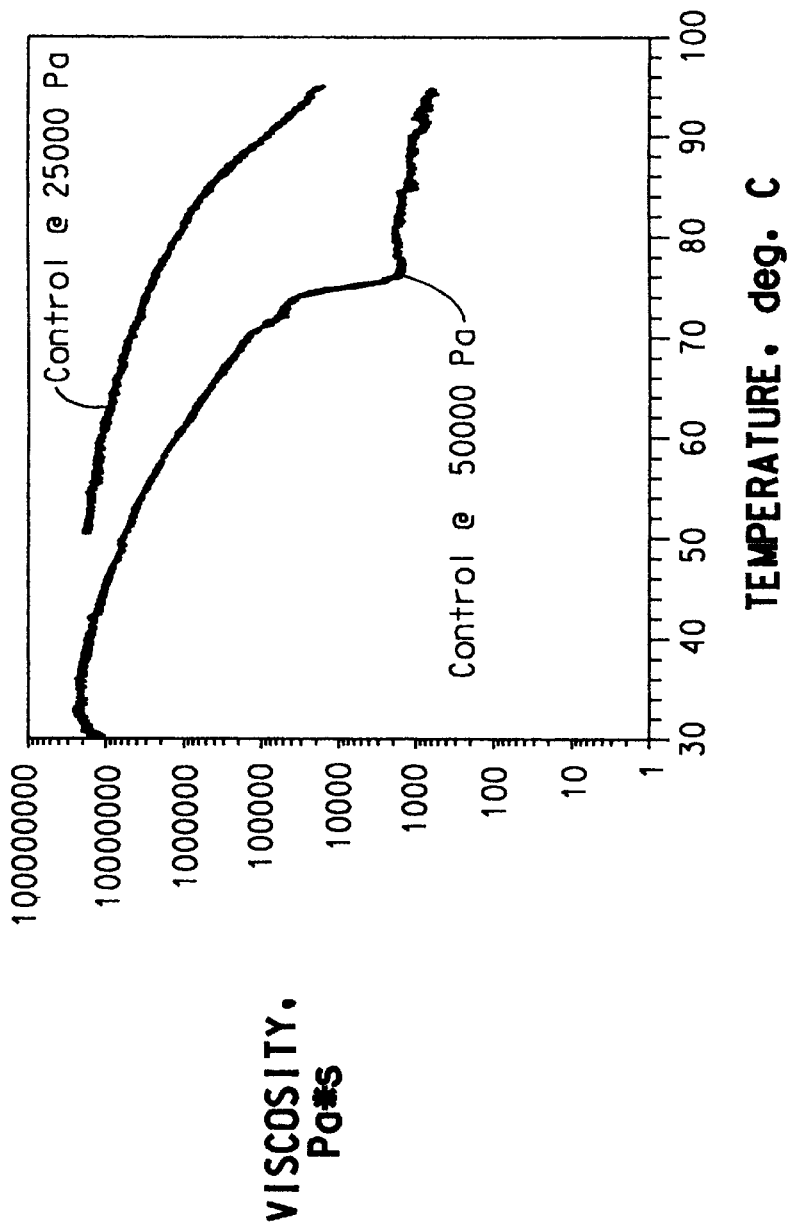
Figure 10C:
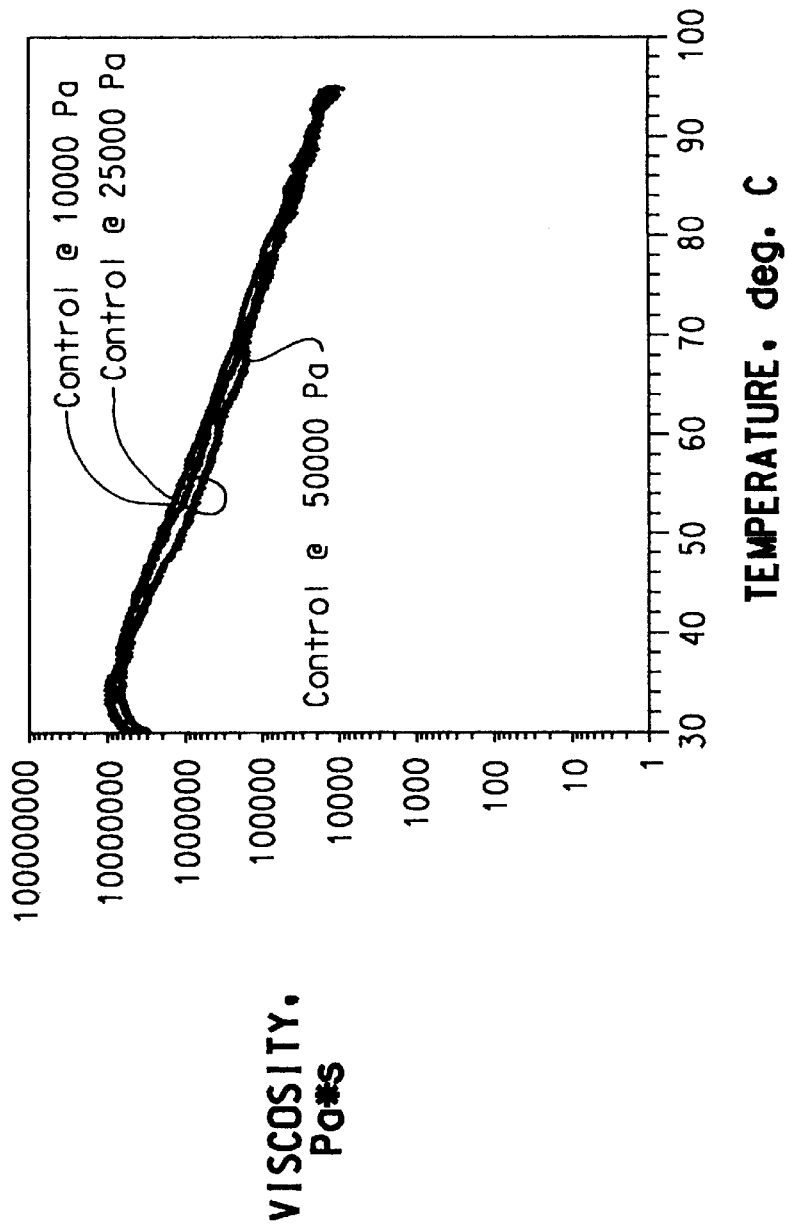

FIG. 10 illustrates the viscosity response of a linear polymer binder composition with different colloidal silicas added. In FIG. 10(a) the same linear polymer binder as in FIG. 9 was present without any added silica. The plot of log viscosity versus temperature was essentially linear for all three shear stresses. The viscosity exhibited very little change with shear. In FIG. 10(b), fumed silica was added at a level of 10 wt %. The plot of log viscosity versus temperature was nonlinear for two different shear stresses. The change in viscosity with shear stress was almost three orders of magnitude at 80° C. In FIG. 10(c), a hydrated colloidal silica was added to the composition at a level of 10 wt %. The plot of log viscosity versus temperature is very nearly identical to that of the linear binder alone, FIG. 10(a), again with almost no change in viscosity with shear stress.

Figure 11A:
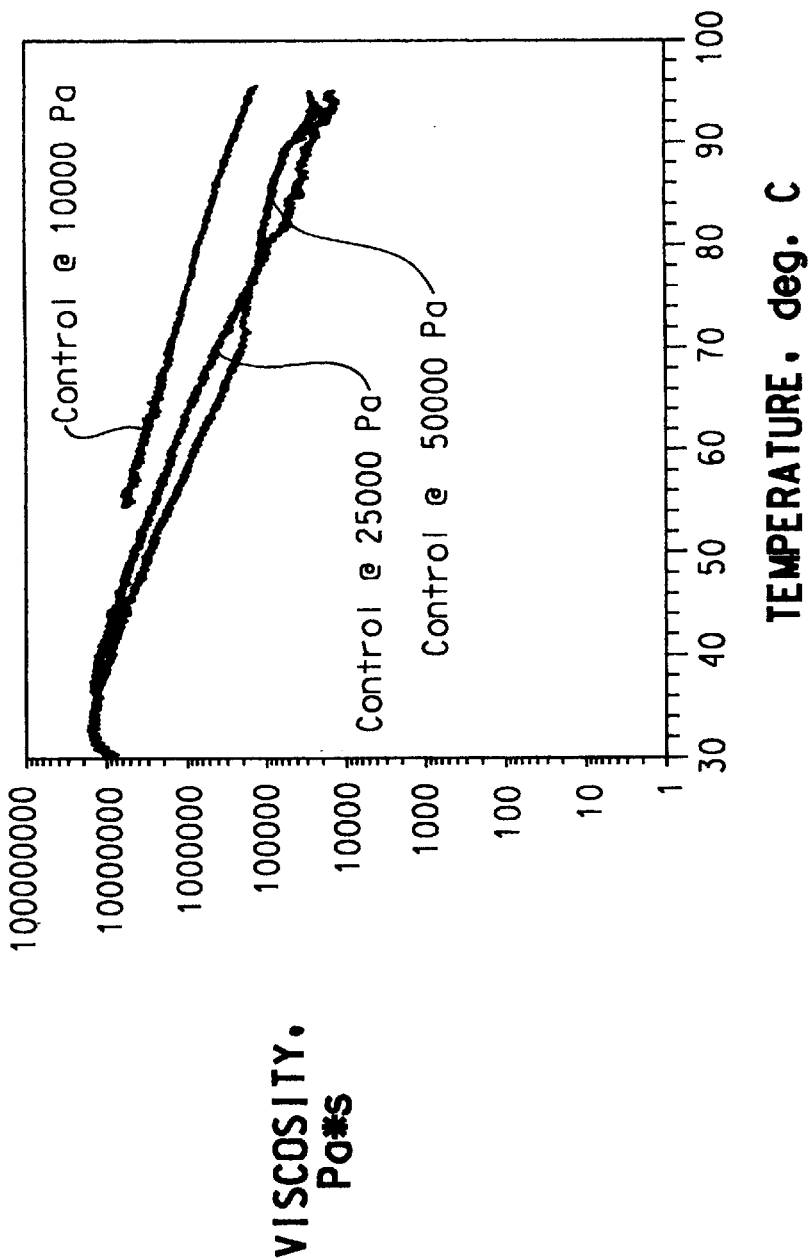
FIG. 11 shows (a) a plot of log viscosity versus temperature at three different shear stresses for a linear copolymer having a linear viscosity response to temperature and a level response to shear, with fumed silica added; (b) a plot of log viscosity versus temperature at three different shear stresses for the same linear copolymer with fumed silica and polyvinylpyrollidone added.
Figure 11B:
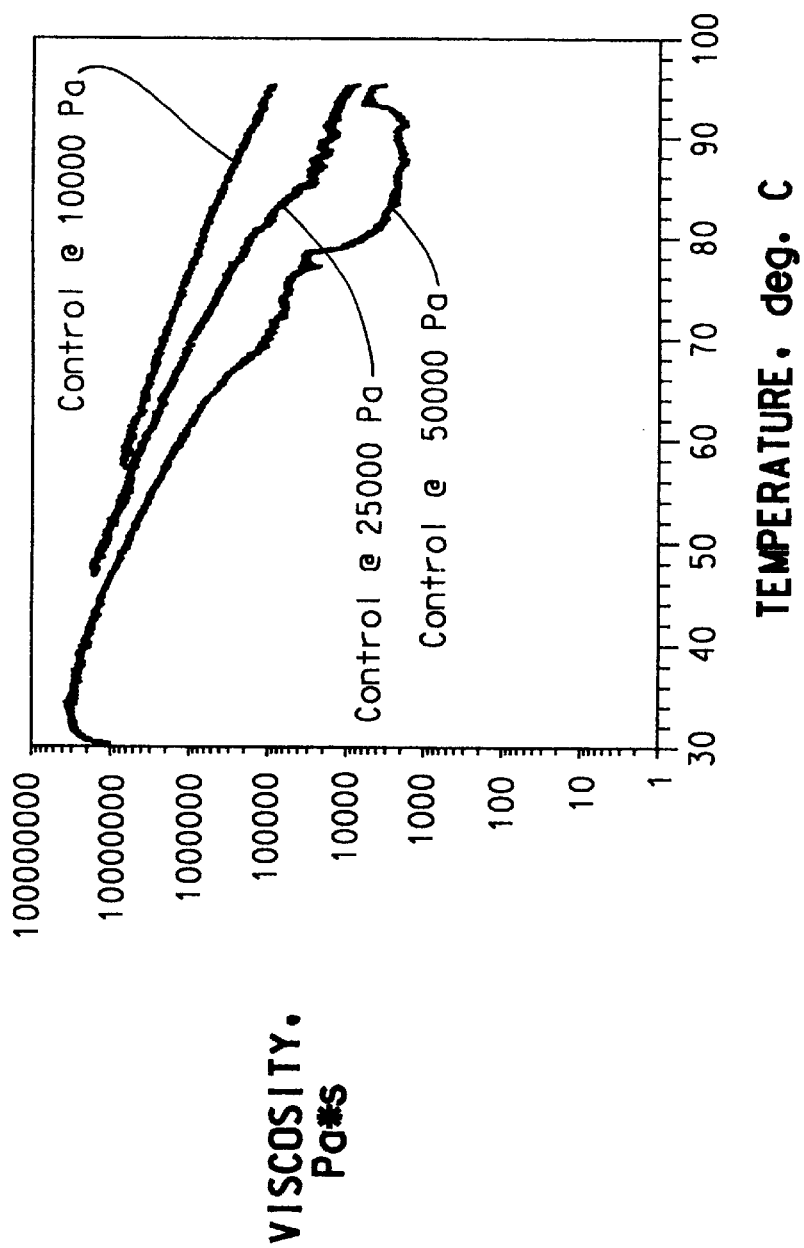

FIG. 11 illustrates the viscosity response of a linear polymer binder composition with colloidal silica and a second linear polymer having hydrogen bonding functionality. In FIG. 11(a), the same linear binder as in FIG. 9 was present with 10 wt % fumed silica added. The plot of log viscosity versus temperature at three different shear stresses shows nonlinearity. Furthermore, there was substantial decrease in viscosity, a factor of 10, as shear stress was varied from 10,000 Pa to 50,000 Pa at 90° C. In FIG. 11(b), 1.5 wt % poly(vinylpyrollidone) was added as a second polymer having hydrogen bonding functionality. The decrease in viscosity with shear stress was about a factor of 100.

Figure 12A:
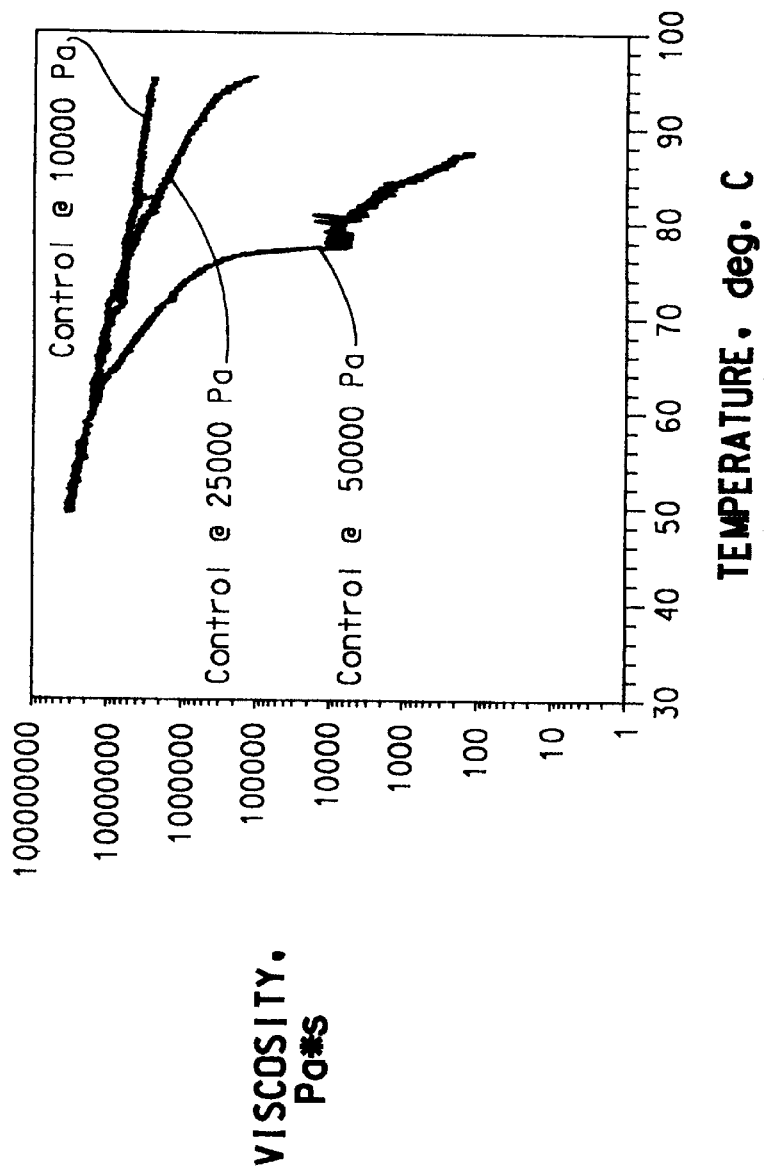
FIG. 12 shows (a) a plot of log viscosity versus temperature at three different shear stresses for a comb polymer according to the invention; and (b) a plot of log viscosity versus temperature at three different shear stresses for the same comb polymer with fumed silica added.
Figure 12B:
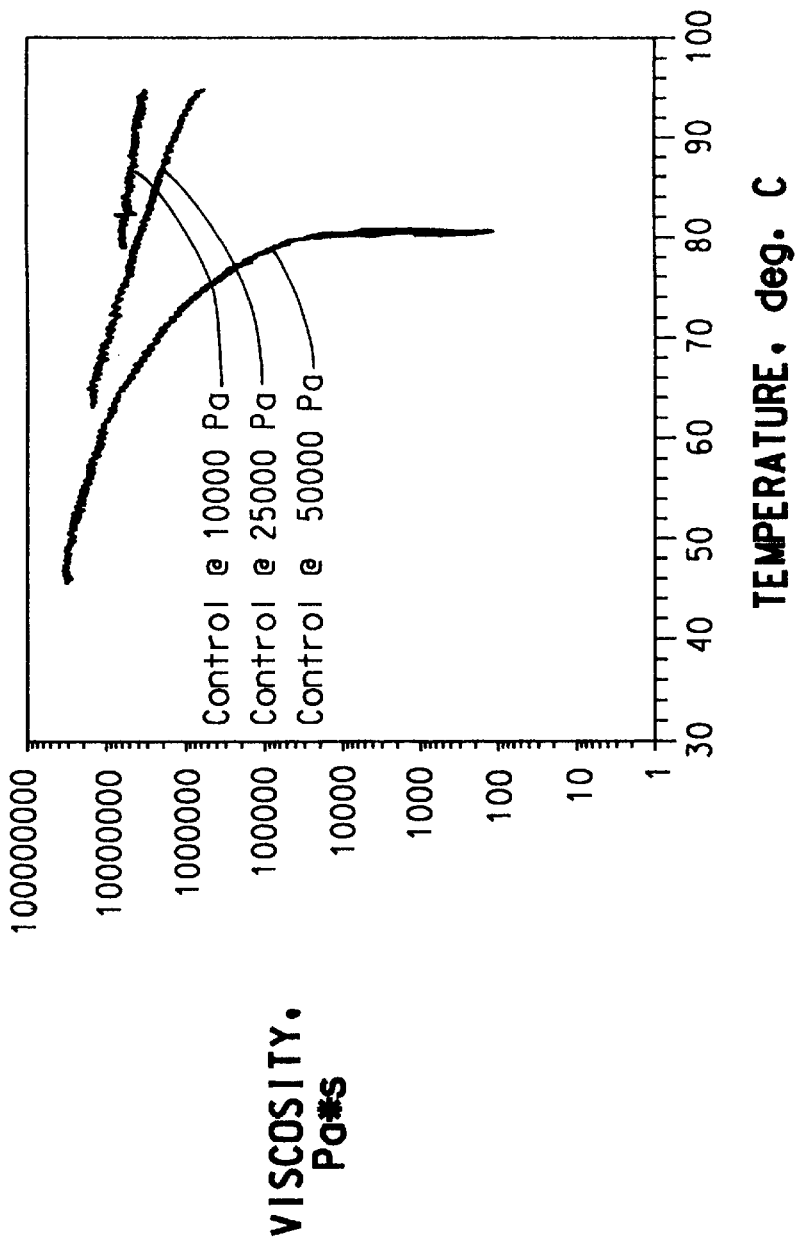

FIG. 12 illustrates the viscosity response of a comb polymer of the invention with and without hydrophilic colloidal silica. In FIG. 12(a), the composition comprises a comb polymer without hydrophilic colloidal silica. The binder polymer was a comb polymer. The backbone was methyl acrylate/styrene/butyl acrylate (6/15/20) with polymeric arms of 50/50 methyl methacrylate/methacrylic acid. The plot of log viscosity versus temperature at different shear stresses was nonlinear. The decrease in viscosity with shear stress was about three orders of magnitude at 80° C. In FIG. 12(b), the same comb polymer was used with 5 wt % fumed silica added. The plot of log viscosity versus temperature was also nonlinear, with the nonlinear portion shifted to a higher temperature range.

The photosensitive compositions of this invention are particularly useful as photoresists for preparing printed circuit boards. Typically, the components of the photosensitive composition are mixed together in a suitable solvent, aqueous-based or non-aqueous. The solution is coated onto a support, typically polyester film, using any conventional coating technique, and dried to form a photosensitive film. The thickness of the film is generally in the range of 1 to 150 micrometers. The film is laminated to a copper clad fiberglass epoxy board or printed circuit relief pattern on the board using heat and/or pressure, e.g., with a conventional hot-roll laminator. The temperature of lamination for such films is typically in the range of 50–120° C. As was discussed above, it is important for the film to flow and provide good coverage of all the surface at the lamination temperature. This is particularly important when laminating to a relief pattern, including patterns having depressions and gentle slopes, in order to avoid air entrapment around small relief parts and circuit lines. The photosensitive films of this invention are uniquely suited for lamination due to the sharp drop in viscosity as temperature is increased.

The applied photosensitive layer is then imagewise exposed to actinic radiation to harden or insolubilize the exposed areas. The unexposed areas are then completely removed, typically with a developer solution which selectively dissolves, strips or otherwise disperses the unexposed areas without adversely affecting the integrity or adhesion of the exposed areas.

While the photosensitive compositions of the invention have improved lamination coating properties, it is important that the other properties of the photoresist not be adversely affected. Thus the compositions should: have good differentiation between exposed and unexposed areas such that the unexposed areas can be removed cleanly and quickly; have good resolution; have adequate solvent resistance, toughness, plating performance, etchant resistance, and flexibility.

The film compositions of the invention, whether or not they are photosensitive, can be applied to a substrate to form an element. Substrates are generally film substrates such as films of polyester, polyimide, polyolefin and the like. The substrate can be a continuous sheet material. The film compositions of the invention can be applied to a continuous sheet substrate and stored in the form of a roll, having at least 50 repeat layers in the roll. The compositions of the invention will not exhibit creep or flow around the edges when stored in roll form at room temperature.

To further illustrate the present invention, the following examples are provided, wherein the amounts of components are given in parts by weight unless otherwise designated.

| Abbreviations | |
|---|---|
| AA | Acrylic acid |
| BA | Butyl acrylate |
| BP | Benzophenone |
| CBZT | Carboxybenzotriazole |
| ClBZT | Chlorobenzotriazole |
| DBC | 2,3-Dibromo-3-phenylpropiophenone |
| 6EO BPE DMA | 6-mole Ethyoxylated bisphenol A dimethacrylate |
| EMK | Ethyl Michler's ketone |
| ETEGMA | Ethyl triethylene glycol methacrylate |
| ITX | Isopropylthioxanthone |
| LCV | Leuco crystal violet |
| MA | Methyl acrylate |
| MAA | Methacrylic acid |
| MEK | Methyl ethyl ketone |
| MMA | Methyl methacrylate |
| Mn | Number average molecular weight |
| Mw | Weight average molecular weight |
| ODAB | 2-Ethylhexyl-4-(dimethylamino)-benzoate |
| Pluronic ® 31R | 31/1 Block copolymer of propylene oxide and ethylene oxide |
| PVP | Polyvinylpyrrolidone, PVP K-15 from International Specialty Products (Wayne, NJ), Mw = 6000–15,000 |
| PVP/VA | Copolymer of vinyl pyrrolidone and vinyl acetate (60/40), MW = 50,000–60,000 |
| SCT | Bis(difluoroboryl) diphenyl gloximato cobalt(II) hydrate |
| Silica 1 | Aerosil ® 200 fumed silica from Degussa (Richfield Park, NJ); added as a dispersion in isopropanol, 13.5% solids |
| Silica 2 | Nissan IPA-ST hydrated silicasol dispersed in isopropanol at 30 wt % silica, obtained from Nissan Chemical America Corp. (Tarrytown, NY) |

| Abbreviations | |
|---|---|
| Silica 3 | Ludox ® hydrated silicasol dispersed in water at 32.5 wt % silica, obtained from E. I. du Pont de Nemours and Company, Inc. (Wilmington, DE) |
| Sty | Styrene |
| TAOBN | 2,3-Diazabicyclo[3.2.2]non-2-ene, 1,4,4-trimethyl-N,N' dioxide |
| TCDM HABI | mixed hexaarylbiimidazole dimers obtained from the oxidative coupling of 2-(o-chlorophenyl)-4,5-diphenylimidazole and 2,4-bis-(o-chlorophenyl)-5-[3,4-dimethoxyphenyl]-imidazole, a reaction product being 2,2',5-tris-(o-chlorophenyl)-4-(3,4-dimethoxyphenyl)-4',5'-diphenyl-biimidazole |
| TMCH | 4-Methyl-4-trichloromethyl-2,4-cyclohexadienone |
| Vazo ® 52 | 2,2'-azobis(2,4-dimethylpentane nitrile), E. I. du Pont de Nemours and Company (Wilmington, DE) |
| Vazo ® 67 | 2,2'-azobis(2-methylpentane nitrile), E. I. du Pont de Nemours and Company (Wilmington, DE) |
| VGD | Victoria Green dye |

All films were prepared by dissolving the components in the solvent indicated and coating onto 0.75 mil (19 micron) polyester using a 10 mil (254 micron) doctor blade. The coatings were air dried at 25° C. to give a dry film layer with a thickness of 38 micrometers.

The photopolymer viscosity was measured using a TA Instruments AR-1000 controlled stress rheometer, using a 1 cm parallel flat plate geometry. The photopolymer thickness of 40 mil (0.1 cm) was obtained by sequentially laminating 1.5 mil (38 micron) thick photopolymer films together. A 1 cm disk was then punched from this sample. Prior to these viscosity measurements the photopolymer sample was conditioned at 50% RH for at least 48 hours. All measurements were conducted at 50+/−5% RH.

The viscosity versus temperature measurements were obtained by ramping the temperature from 30 to 95° C. at 1.4° C./min, with shear stress of 25,000 Pa. The viscosity versus temperature ratings were defined as:

0=linear log viscosity vs. temperature curve
+=nonlinear log viscosity vs. temperature curve
++=very nonlinear log viscosity vs. temperature curve The viscosity versus shear stress measurements were obtained by ramping the shear stress from 300 to 50,000 Pa at 1,104 Pa/min using a constant temperature of 80° C. The viscosity versus shear ratings were defined as:

0=level log viscosity versus shear stress curve
+=steep log viscosity versus shear stress curve
++=very steep log viscosity versus shear stress curve In some cases the viscosity versus temperature was measured as described above but at three different levels of shear stress: 10,000, 25,000, and 50,000 Pa. In these cases, the three different plots of log viscosity versus temperature were placed on the same graph to illustrate the effect of shear stress.

A photopolymer film/copper laminate was prepared in order to test for development time, photospeed, stripping time and sidewall quality. The 1.5 mil (38 micron) photopolymer films were laminated to 1 oz. (28 g) brush scrubbed copper FR-4 laminate, using a hot roll laminator at 1.5 m/min and a roll temperature of 105° C.

The development time was measured as the time required to completely remove the photopolymer from the copper laminate using 1% sodium carbonate aqueous solution at 85° C. in a Chemcut CS2000 developer with a spray pressure of 28 psi. The development time is reported in seconds.

The photospeed was measured using a 41 step Stouffer density tablet. The film was exposed with 60 mJ/cm$^2$, using a DuPont PC-130 exposure unit (E. I. du Pont de Nemours and Company, Wilmington, Del.), and using a total time in the developer chamber of 1.5 times the minimum development time. The last step in which at least 50% of the photopolymer remained was determined. This step was reported as the photospeed.

The stripping time was measured as the time to remove the exposed (60 mJ/cm$^2$) and developed photopolymer from the copper laminate in a stirred beaker solution of 1.5% aqueous potassium hydroxide at 130° C. The stripping time is reported in seconds.

The sidewall quality rating of the developed photopolymer was obtained by rating the quality of the exposed and developed photopolymer sidewall from a scanning electron micrograph taken at 500×magnification. The exposure energy was varied for each film to obtain a step held of 20 using a total time in the developer chamber of 5 times the minimum development time for Examples 1–17; 3⅓ times for Examples 18–21. The top, middle, and base of the sidewall were rated using the following criteria:

| | |
|---|---|
| top: | +2 = no swelling |
| | −2 = severely swollen |
| middle: | +2 = no developer attack |
| | −2 = severe developer attack |
| base: | +2 = no positive or negative foot |
| | −2 = large positive or negative foot | where "foot" indicates an extension of the sidewall, either convex or concave.

Preparation of Comb Polymer

The preparation of comb polymer 1 is illustrative of the general procedure. All other comb polymers were made using a similar procedure and varying the components and proportions.

Macromer solution was prepared using the following procedure: A reactor equipped with an agitator, dual feeds, condenser and nitrogen blanket was charged with methanol, 30% of the total MAA and 60% of the total MMA, and heated to reflux. An initiator feed for Vazo® 52 was then added over 330 minutes. The remaining monomer was then added over 240 minutes. Reflux was continued for an additional 75 minutes, and then the solution was cooled.

Comb polymer 1 was prepared using the following procedure: A reactor equipped with an agitator, dual feeds, condenser and nitrogen blanket was charged with macromer solution from above, 0–110% of the acrylate monomer, approximately 10% of the methacrylate monomer, and 90% of the styrene monomer, and heated to reflux. If no methacrylate monomer was present, 50% of any acrylate monomers and 50% of the styrene monomer were charged to the reactor in the initial step. An initiator feed was added over 3 minutes and then simultaneous feeds were begun for the addition of the remaining monomer and addition of another initiator solution. Convenient feed times were on the order of 3 hours. After a 2–3 hour hold period, several additional short initiator feeds were made, with 2 hour holds in between the feeds.

The resulting comb polymer 1 had the following composition:

| | |
|---|---|
| Macromer composition | 50 MMA/50 MAA |
| Macromer Mn | 3400 |
| Backbone composition | 45 MA/30 STY/25 BA |
| Backbone/Macromer | 55/45 |
| Comb polymer Mw | 39,200 |

EXAMPLES 1–2

These examples illustrate the nonlinear temperature response of compositions of the invention in non-photosensitive films.

Comb polymer 2 and Comparative comb polymer A (not of the invention) were prepared as described above with the following composition:

| | | Comparative |
|---|---|---|
| | Comb Pol. 2 | Comb Pol. A |
| Macro Comp. | 50 MMA/50 MAA | 65 MMA/35 MAA |
| Macro Mn | 3600 | 3800 |
| Back. Comp. | 17 MA/45 STY/38 BA | 45 MA/30 STY/25 BA |
| Back/Macro | 65/35 | 55/45 |
| Comb Mw | 33,300 | 51,900 |

A linear control polymer A was prepared having the composition MMA/EA/MAA/BA/Sty (30/3/23/24/10), with a molecular weight of 88,500.

Solutions of 61.2 wt % polymer and 38.8 wt % triacetin were prepared in a solvent of 56/26/18 acetone/MEK/methanol at 45% solids, and coated to form films.

The films were tested for viscosity response to temperature with the results given below:

| Polymer | Visc. Vs Temperature | Visc. Vs Shear Stress |
|---|---|---|
| Comb Pol. 1 | ++ | ++ |
| Comb Pol. 2 | ++ | ++ |
| Comparative A | 0 | 0 |
| Control A | 0 | 0 |

EXAMPLES 3–5

These examples illustrate the nonlinear viscosity response of the compositions of the invention in photosensitive films.

Comb polymers 3, 4 and 5 were prepared as described above with the resulting compositions:

| | Comb Pol. 3 | Comb Pol. 4 | Comb Pol. 5 |
|---|---|---|---|
| Macro Comp. | MMA/MAA 50/50 | MMA/MAA 50/50 | MMA/MAA 50/50 |
| Macro Mn | 4500 | 4500 | 3400 |
| Back. Comp. | MMA/STY/BA 45/29/26 | MMA/STY/BA 37/32/31 | MMA/STY/BA 25/36/38 |
| Back/Macro | 70/30 | 63/37 | 55/45 |
| Comb Mw | 27,500 | 26,900 | 24,500 |

A linear control polymer B was prepared having the composition MMA/EA/MAA/BA/Sty (30/3/23/24/20), with a molecular weight of 88,500.

Photosensitive solutions were prepared having the following composition:

| Component | Wt. % Solids |
|---|---|
| Binder polymer | 61.000 |
| TMPEOTA | 15.000 |
| 6EO BPE DMA | 6.000 |
| 7PO DMA | 6.500 |
| BP | 5.000 |
| ODAB | 2.000 |
| DBC | 0.150 |
| CBZT | 0.030 |
| EMK | 0.140 |
| ITX | 0.250 |
| ClBZT | 0.030 |
| TAOBN | 0.030 |
| LCV | 0.350 |
| VGD | 0.040 |
| TMCH | 0.250 |
| Pluronic ® 31R | 3.000 |

Solutions of 45% solids in 50/50 acetone/methanol coated to form films.

The films were tested for viscosity response to temperature and shear stress, development time, photospeed, stripping time, and developed photopolymer sidewall quality with the results given below:

| Polymer | Visc. vs. Temp | Visc. vs. Shear | Devel. Time | Photo-Speed | Side-Strip Time | Wall Rating |
|---|---|---|---|---|---|---|
| Comb Pol. 3 | ++ | ++ | 164 | 25 | 165 | NA |
| Comb Pol. 4 | ++ | ++ | 49 | 26 | 83 | −5 |
| Comb Pol. 5 | ++ | ++ | 30 | 23 | 67 | −2 |
| Control B | 0 | 0 | 28 | 25 | 146 | −3 |

EXAMPLES 6–10

These examples illustrate the use of different molecular weight macromers and different backbone compositions in the comb polymers useful in the invention.

Comb polymers 6, 7, 8, 9, and 10, and Comparative comb polymer B were prepared as described above with the resulting compositions:

| | Comb Pol. 6 | Comb Pol. 7 | Comb Pol. 8 |
|---|---|---|---|
| Macro Comp. | MMA/MAA 50/50 | MMA/MAA 50/50 | MMA/MAA 50/50 |
| Macro Mn | 3600 | 2500 | 2500 |
| Back. Comp. | MMA/STY/BA 25/36/38 | MMA/STY/BA 25/36/38 | MMA/STY/BA 25/36/38 |
| Back/Macro | 55/45 | 55/45 | 55/45 |
| Comb Mw | 24,800 | 19,800 | 23,500 |

| | | Comparative | |
|---|---|---|---|
| | Comb Pol. 9 | Comb Pol. 10 | Comb Pol. B |
| Macro Comp. | MMA/MAA 50/50 | MMA/MAA 50/50 | MMA/MAA 50/50 |
| Macro Mn | 3600 | 3400 | 2500 |
| Back. Comp. | MA/STY/BA 45/30/25 | MA/STY/BA 45/30/25 | MA/STY/BA 45/30/25 |
| Back/Macro | 55/45 | 55/45 | 55/45 |
| Comb Mw | 38,700 | 39,200 | 30,700 |

A linear control polymer C was prepared having the composition MMA/EA/MAA/BA/Sty (30/3/23/24/20), with a molecular weight of 88,500.

Photosensitive solutions were prepared having the following composition:

| Component | Wt. % Solids |
|---|---|
| Binder polymer | 60.000 |
| TMPEOTA | 22.500 |
| 6EO BPE DMA | 6.000 |
| BP | 5.000 |
| ODAB | 2.000 |
| DBC | 0.150 |
| CBZT | 0.030 |
| EMK | 0.140 |
| ITX | 0.250 |
| ClBZT | 0.030 |
| TAOBN | 0.030 |
| LCV | 0.350 |
| VGD | 0.040 |
| TMCH | 0.250 |
| Pluronic ® 31R | 3.000 |

Solutions of 45% solids in 53/16/31 acetone/MEK/methanol were coated to form films.

The films were tested for viscosity response to temperature and shear stress, development time, photospeed, stripping time, and developed photopolymer sidewall quality with the results given below:

| Polymer | Visc. vs. Temp | Visc. vs. Shear | Devel. Time | Photo-Speed | Side-Strip Time | Wall Rating |
|---|---|---|---|---|---|---|
| Comb Pol. 6 | ++ | ++ | 25 | 27 | 113 | 0 |
| Comb Pol. 7 | ++ | ++ | 22 | 26 | 116 | 0 |
| Comb Pol. 8 | ++ | ++ | 22 | 28 | 114 | 0 |
| Comb Pol. 9 | ++ | ++ | 21 | 30 | 149 | 3 |
| Comb Pol. 10 | ++ | ++ | 20 | 30 | 144 | 1 |
| Comp. B | 0 | 0 | 17 | 28 | 158 | 3 |
| Control C | 0 | 0 | 25 | 29 | 210 | −1 |

EXAMPLES 11–14

These examples illustrate the use of high levels of hydrogen bonding monomer in the macromer and different backbone compositions in the comb polymers useful in the invention.

Comb polymers 11–14 were prepared as described above with the resulting compositions:

| | Comb Pol. 11 | Comb Pol. 12 | Comb Pol. 13 |
|---|---|---|---|
| Macro Comp. | ETGMA/MAA 15/85 | ETGMA/MAA 15/85 | ETGMA/MAA 15/85 |
| Macro Mn | 1900 | 1900 | 1800 |
| Back. Comp. | MA/STY/BA | MA/STY/BA | MA/STY/BA |

-continued

| | 45/30/25 | 45/30/25 | 45/30/25 |
|---|---|---|---|
| Back/Macro | 55/45 | 74/26 | 80/20 |
| Comb Mw | 12,600 | 30,200 | 53,500 |

| | Comb Pol. 14 |
|---|---|
| Macro Comp. | ETGMA/MAA 15/85 |
| Macro Mn | 1400 |
| Back. Comp | MA/STY/BA 24/37/38 |
| Back/Macro | 79/21 |
| Comb Mw | 29,600 |

A linear control polymer D was prepared having the composition MMA/EA/MAA/BA/Sty (30/3/23/24/20), with a molecular weight of 88,500.

Photosensitive solutions were prepared having the following composition:

| Component | Wt. % Solids |
|---|---|
| Binder polymer | 60.000 |
| TMPEOTA | 22.500 |
| 6EO BPE DMA | 6.000 |
| BP | 5.000 |
| ODAB | 2.000 |
| DBC | 0.150 |
| CBZT | 0.030 |
| EMK | 0.140 |
| ITX | 0.250 |
| ClBZT | 0.030 |
| TAOBN | 0.030 |
| LCV | 0.350 |
| VGD | 0.040 |
| TMCH | 0.250 |
| Pluronic ® 31R | 3.000 |

Solutions of 45% solids in 53/16/31 acetone/MEK/methanol were coated to form films with a dry thickness of 1.5 mils (38.1 microns).

The films were tested for viscosity response to temperature and shear stress, development time, photospeed, stripping time, and developed photopolymer sidewall quality with the results given below:

| Polymer | Visc. vs. Temp | Visc. vs. Shear | Devel. Time | Photo-Speed | Side-Strip Time | Wall Rating |
|---|---|---|---|---|---|---|
| Comb Pol. 11 | ++ | ++ | 14 | 23 | 48 | 3 |
| Comb Pol. 12 | ++ | ++ | 17 | 28 | 76 | 0 |
| Comb Pol. 13 | ++ | ++ | 54 | 29 | 155 | −1 |
| Comb Pol. 14 | ++ | ++ | 37 | 27 | 164 | −1 |
| Control D | 0 | 0 | 26 | 25 | 143 | −3 |

The viscosity variations of the film made from Comb Polymer 12 are shown in FIG. 3. The viscosity variations of the film made from control polymer D are shown in FIG. 1.

EXAMPLES 15 AND 16

This example illustrates that having additional monomer capable of hydrogen bonding in the backbone is not equivalent to having the monomer in the polymeric arms.

Comb polymer 15 and comparative comb polymer C were prepared as described above with the resulting compositions:

| | | | Comparative |
|---|---|---|---|
| | Comb Pol. 15 | Comb Pol. 16 | Comb Pol. C |
| Macro Comp. | MMA/MAA 50/50 | MMA/MAA 50/50 | MMA/MAA 65/35 |
| Macro Mn | 3600 | 3600 | 2800 |
| Back. Comp. | MA/STY/BA 17/45/38 | MA/STY/BA 45/30/25 | MA/STY/BA/AA 35/30/25/10 |
| Back/Macro | 65/35 | 55/45 | 55/45 |
| Comb Mw | 33,300 | 38,700 | 36,600 |

Photosensitive solutions were prepared having the same composition as Examples 11–14. Example 15 and Comparative C were coated from a solution of 56/26/18 acetone/MEK/methanol at 45% solids. Example 16 was coated from a solution of 53/16/31 acetone/MEK/methanol at 45% solids to form a film with a dried thickness of 1.5 mils (38.1 microns).

The films were tested for viscosity response to temperature and shear stress, development time, photospeed, stripping time, and developed photopolymer sidewall quality with the results given below:

| Polymer | Visc. vs. Temp | Visc. vs. Shear | Devel. Time | Photo-Speed | Side-Strip Time | Wall Rating |
|---|---|---|---|---|---|---|
| Comb Pol. 15 | + | + | 23 | 27 | 140 | −1 |
| Comb Pol. 16 | ++ | ++ | 21 | 30 | 149 | 3 |
| Comparative C | 0 | 0 | 12 | 27 | 107 | 2 |

EXAMPLE 17

This example illustrates a composition of the invention in which a linear polymer with hydrogen bonding functionality is added to a comb polymer with linear viscosity response to form a composition with non-linear viscosity response.

Comparative comb polymer D was prepared as described above with the resulting composition:

| | Comparative Comb Pol. D |
|---|---|
| Macro Comp. | MMA/MAA 65/35 |
| Macro Mn | 3800 |
| Back. Comp. | MA/STY/BA 45/30/25 |
| Back/Macro | 55/45 |
| Comb Mw | 51,900 |

Photosensitive solutions were prepared having the same composition as Examples 11–14. In Comparative Example D, the binder composition was 100% comb polymer D. In Example 17, the binder composition was 97 wt % comb polymer D plus 3 wt % polyvinylpyrrolidone. The compositions were coated from a solution of 56/26/18 acetone/MEK/methanol at 45% solids, to form a film with a dried thickness of 1.5 mils (38.1 microns).

The films were tested for viscosity response to temperature and shear stress, development time, photospeed, stripping time, and developed photopolymer sidewall quality with the results given below:

| Film | Visc. vs. Temp | Visc. vs. Shear | Devel. Time | Photo-Speed | Side-Strip Time | Wall Rating |
|---|---|---|---|---|---|---|
| Comp. D | 0 | 0 | 26 | 29 | 131 | 2 |
| Ex. 17 | + | ++ | 27 | 30 | 127 | 2 |

The viscosity variations of the film made from Comb Polymer 15 are shown in FIG. 4.

EXAMPLE 18

This example illustrates photosensitive film compositions of the invention comprising a linear polymer binder and fumed silicas as a hydrophilic colloidal silica. The linear polymer binder had the composition MMA/MAA/BA/BMA (36/23/16/25) with a molecular weight of 65,800. A control film without hydrophilic colloidal silica is included for comparison.

Photosensitive solutions were prepared from acetone/isopropanol (38/62 by volume) with 45–55% solids, having the following composition:

| | Wt. % Solids | |
|---|---|---|
| Component | Example 18 | Control |
| Binder polymer | 53.000 | 63.00 |
| Silica 1 | 10.000 | 0 |
| TMPEOTA | 14.500 | 14.50 |
| 7PO DMA | 14.000 | 14.00 |
| BP | 2.000 | 2.00 |
| TCDM HABI | 1.000 | 1.00 |
| DBC | 0.250 | 0.25 |
| EMK | 0.150 | 0.15 |
| DEHA | 0.020 | 0.02 |
| LCV | 0.350 | 0.35 |
| VGD | 0.060 | 0.06 |
| N-Phenylglycine | 0.050 | 0.05 |
| Pluronic ® 31R | 4.600 | 4.60 |

Films were prepared as described above from acetone/isopropanol (38/62 by volume) at 45–55% solids, with a dry thickness of 0.75 mils (19 cm). The films were tested for viscosity response to temperature and shear stress, development time, photospeed, stripping time, and developed photopolymer sidewall quality with the results given below:

| Polymer | Visc. vs. Temp | Visc. vs. Shear | Devel. Time | Photo-Speed | Side-Strip Time | Wall Rating |
|---|---|---|---|---|---|---|
| Example 18 | + | ++ | 9 | 26 | 54 | 0 |
| Control | 0 | 0 | 9 | 26 | 42 | 0 |

The films were also tested for air entrapment. The films were laminated to 7628 laminate weave fiberglass-epoxy copper laminate at 105° C. The amount and size of air entrappped was examined by visual inspection with a microscope at 10.5×magnification, and evaluated as follows:

| Amount: | 1 = entrapped air in 100% of 7628 weave rectangles |
| | 5 = entrapped air in 50% of 7628 weave rectangles |
| | 10 = entrapped air in 0% of 7628 weave rectangles |
| Size: | 1 = entrapped air covers 100% of 7628 weave rectangles |
| | 5 = entrapped air covers 50% of 7628 weave rectangles |
| | 10 = entrapped air covers 0% of 7628 weave rectangles |

For Example 18 and the control sample the results were as follows:

| Example 18: | amount = 3 | size = 5 |
|---|---|---|
| Control: | amount = 2 | size = 2 |

The viscosity variations of the film made with the composition of Example 18 are shown in FIG. 9b. The viscosity variations of the film made with the control composition are shown in FIG. 9a.

EXAMPLE 19, COMPARATIVE EXAMPLE A

This example illustrates photosensitive film compositions of the invention comprising a linear polymer binder and two different types of hydrophilic colloidal silica—fumed silica (Silica 1) and a hydrated hydrophilic silica 5 (Silica 2). The linear polymer binder had the composition of Example 18. A control film without silica is included for comparison.

Photosensitive solutions were prepared having the following composition:

| | Wt. % Solids | | |
|---|---|---|---|
| Component | Example 19 | Comparative A | Control |
| Binder polymer | 51.100 | 51.1 | 63.00 |
| Silica 1 | 10.000 | 0 | 0 |
| Silica 2 | 0 | 10.00 | 0 |
| TMPEOTA | 14.500 | 14.50 | 14.5 |
| 7PO DMA | 14.000 | 14.00 | 14.00 |
| BP | 2.000 | 2.00 | 2.00 |
| TCDM HABI | 1.000 | 1.00 | 1.00 |
| DBC | 0.250 | 0.25 | 0.25 |
| EMK | 0.150 | 0.15 | 0.15 |
| DEHA | 0.020 | 0.02 | 0.02 |
| LCV | 0.350 | 0.35 | 0.35 |
| VGD | 0.060 | 0.06 | 0.06 |
| N-Phenylglycine | 0.050 | 0.05 | 0.05 |
| Pluronic ® 31R | 4.600 | 4.60 | 4.60 |

Films were prepared as described above from acetone/isopropanol (38/62 by volume) at 45–55% solids, with a dry thickness of 0.75 mils (19 cm). The films were tested for viscosity response to temperature and shear stress, with the results given below:

| Polymer | Visc. vs. Temp. | Visc. vs. Shear |
|---|---|---|
| Example 19 | ++++ | |
| Comparative A | 0 | 0 |
| Control | 0 | 0 |

The fumed silica, Aerosil® 200, was effective at the 10 weight % level; the hydrated silica, Nissan IPA-ST, was not effective at that level. The viscosity variations of the film made with the composition of Example 19 are shown in FIG.

10b. The viscosity variations of the film made with the composition of Comparative A are shown in FIG. 10c. The viscosity variations of the film made with the control composition are shown in FIG. 10a.

EXAMPLE 20

This example illustrates films of the invention in which non-hydrated hydrophilic colloidal silica (fumed silica) is added to a linear binder polymer and the rheology is further modified with a second linear polymer having hydrogen bonding functionality.

Photosensitive solutions were prepared having the following composition:

|  | Wt. % Solids | |
|---|---|---|
| Component | Example 20-A | Example 20-B |
| Binder polymer | 55.000 | 53.50 |
| Silica 1 | 8.300 | 8.30 |
| PVPK-15 | 0 | 1.50 |
| TMPEOTA | 14.500 | 14.50 |
| 7PO DMA | 14.000 | 14.00 |
| BP | 2.000 | 2.00 |
| TCDM HABI | 1.000 | 1.00 |
| DBC | 0.250 | 0.25 |
| EMK | 0.150 | 0.15 |
| DEHA | 0.020 | 0.02 |
| LCV | 0.350 | 0.35 |
| VGD | 0.060 | 0.06 |
| N-Phenylglycine | 0.050 | 0.05 |
| Pluronic ® 31R | 4.600 | 4.60 |

Films were prepared as described above from acetone/isopropanol (38/62 by volume) at 45–55% solids, with a dry thickness of 0.75 mils (19 cm). The films were tested for viscosity response to temperature and shear stress, development time, photospeed, stripping time, and developed photopolymer sidewall quality with the results given below:

| Polymer | Visc. vs. Temp. | Visc. vs. Shear | Devel. Time | Photo-Speed | Side-Strip Time | Wall Rating |
|---|---|---|---|---|---|---|
| Example 20-A | + | ++ | 10 | 28 | 50 | 0 |
| Example 20-B | ++ | ++ | 12 | 27 | 49 | 0 |

The viscosity variations of the film made with the composition of Examples 20-A and 20-B are shown in FIGS. 11a and 11b, respectively.

EXAMPLE 21

This example illustrates films of the invention in which a non-hydrated hydrophilic colloidal silica is added to a comb binder polymer.

Comb Polymer 17 was prepared as described above with the following composition:

| Macromer composition | 50 MMA/50 MAA |
|---|---|
| Macromer Mn | 3842 |
| Backbone composition | 65 MA/15 STY/20 BA |
| Backbone/Macromer | 66/34 |
| Comb polymer Mw | 83,601 |

Photosensitive solutions were prepared having the following composition:

|  | Wt. % Solids | |
|---|---|---|
| Component | Example 21-A | Example 21-B |
| Comb Pol. 17 | 63.300 | 58.30 |
| Silica 1 | 0 | 5.00 |
| TMPEOTA | 14.500 | 14.50 |
| 7PO DMA | 14.000 | 14.00 |
| BP | 2.000 | 2.00 |
| TCDM HABI | 1.000 | 1.00 |
| DBC | 0.250 | 0.25 |
| EMK | 0.150 | 0.15 |
| DEHA | 0.020 | 0.02 |
| LCV | 0.350 | 0.35 |
| VGD | 0.060 | 0.06 |
| N-Phenylglycine | 0.050 | 0.05 |
| Pluronic ® 31R | 4.600 | 4.60 |

Films were prepared as described above from acetone/isopropanol/methanol (64/23/13 by volume) at 42–45% solids, with a dry thickness of 0.75 mils (19 cm). The films were tested for viscosity response to temperature and shear stress, development time, photospeed, stripping time, and developed photopolymer sidewall quality with the results given below:

| Polymer | Visc. vs. Temp. | Visc. vs. Shear | Devel. Time | Photo-Speed | Side-Strip Time | Wall Rating |
|---|---|---|---|---|---|---|
| Example 21-A | ++ | ++ | 18 | 24 | 37 | 2 |
| Example 21-B | ++ | ++ | 14 | 26 | 33 | 2 |

The viscosity variations of the film made with the composition of Examples 21-A and 21-B are shown in FIGS. 12a and 12b, respectively.

Comparative Example B, C and D

This example illustrates photosensitive film compositions of the invention comprising a linear polymer binder and a hydrophilic colloidal silica which is hydrated. In one composition, a second linear polymer having hydrogen bonding functionality is also added. The linear polymer binder had the composition of Example 18. A control film without silica is included for comparison.

Photosensitive solutions were prepared having the following composition:

|  | Wt. % Solids | | | |
| --- | --- | --- | --- | --- |
| Component | Comp. B. | Comp. C | Comp. D | Control |
| Binder polymer | 53.100 | 48.1 | 52.1 | 63.00 |
| Silica 3 | 10.000 | 15.0 | 10.0 | 0 |
| PVP/VA | 0 | 0 | 1.0 | 0 |
| TMPEOTA | 14.500 | 14.50 | 14.5 | 14.5 |
| 7PO DMA | 14.000 | 14.00 | 14.0 | 14.00 |
| BP | 2.000 | 2.00 | 2.0 | 2.00 |
| TCDM HABI | 1.000 | 1.00 | 1.0 | 1.00 |
| DBC | 0.250 | 0.25 | 0.25 | 0.25 |
| EMK | 0.150 | 0.15 | 0.15 | 0.15 |
| DEHA | 0.020 | 0.02 | 0.02 | 0.02 |
| LCV | 0.350 | 0.35 | 0.35 | 0.35 |
| VGD | 0.060 | 0.06 | 0.06 | 0.06 |
| N-Phenylglycine | 0.050 | 0.05 | 0.05 | 0.05 |
| Pluronic ® 31R | 4.600 | 4.60 | 4.60 | 4.60 |

Films were prepared as described above from acetone/isopropanol (38/62 by volume) at 45–55% solids, with a dry thickness of 0.75 mils (19 cm). The films were tested for viscosity response to temperature and shear stress, with the results given below:

| Polymer | Visc. vs. Temp. | Visc. vs. Shear |
| --- | --- | --- |
| Comparative B | 0 | 0 |
| Comparative C | 0 | 0 |
| Comparative D | 0 | 0 |
| Control | 0 | 0 |

The hydrated silica was not effective in changing the rheology of the film at either the 10% or 15% level, or with the second linear polymer with hydrogen bonding functionality.

What is claimed is:

1. A polymeric film composition comprising a polymeric binder in an amount of about 40–70% by weight based upon the total weight of the composition, the polymeric binder, having hydrogen bonding functionality and having a weight average molecular weight greater than 20,000 wherein the binder consists essentially of a comb polymer comprising a backbone and more than one polymeric arm, wherein at a predetermined first lower temperature range of about 20–50° C. and a shear stress of 10,000 Pa the film composition has a viscosity of at least $3\times10^6$ Pa-s, and wherein at a predetermined second higher temperature in the range of 70–100° C. and a shear stress of 50,000 Pa, the film composition has a viscosity of no greater than $1\times10^4$ Pa-s, wherein one of the following conditions is met:

I.
  (i) the polymeric arms are copolymers derived from monomers comprising 40–80% by weight of a monomer having a functionality capable of hydrogen bonding;
  (ii) the number average molecular weight of the polymeric arms is greater than 2500; and
  (iii) the weight ratio of the backbone to the arms is less than 3;

OR

II.
  (i) the polymeric arms are copolymers derived from monomers comprising greater than 70% by weight of a monomer having a functionality capable of hydrogen bonding;
  (ii) the number average molecular weight of the polymeric arms is less than 2500; and
  (iii) the weight ratio of the backbone to the arms is less than 4 wherein the comb polymer is prepared by an addition polymerization process in which a macromer having hydrogen bonding capability is copolymerized with monomers which form the backbone, and further wherein the functionality capable of hydrogen bonding is selected from the group consisting of carboxyl, amide, hydroxyl, amino, pyridyl, oxy, and carbamoyl.

2. The polymeric film composition of claim 1 wherein the monomer having functionality capable of hydrogen bonding is selected from the group consisting of acrylic acid, methacrylic acid and mixtures thereof.

3. The polymeric film composition of claim 1 wherein the polymeric arm further comprises a monomer selected from the group consisting of acrylates, methacrylates, styrene, substituted styrenes, acrylonitrile, and mixtures thereof.

4. The polymeric film composition of claim 1 wherein the backbone comprises a monomer selected from the group consisting of acrylates, methacrylates, styrene, substituted styrenes, acrylonitrile, and mixtures thereof.

* * * * *